(12) United States Patent
Fukamachi et al.

(10) Patent No.: US 8,767,859 B2
(45) Date of Patent: Jul. 1, 2014

(54) HIGH-FREQUENCY CIRCUIT, HIGH-FREQUENCY DEVICE, AND COMMUNICATIONS APPARATUS

(75) Inventors: Keisuke Fukamachi, Kumagaya (JP); Shigeru Kemmochi, Kumagaya (JP)

(73) Assignee: Hitachi Metals, Ltd., Tokyo (JP)

( * ) Notice: Subject to any disclaimer, the term of this patent is extended or adjusted under 35 U.S.C. 154(b) by 477 days.

(21) Appl. No.: 13/001,302

(22) PCT Filed: Jun. 17, 2009

(86) PCT No.: PCT/JP2009/061055
§ 371 (c)(1),
(2), (4) Date: Dec. 23, 2010

(87) PCT Pub. No.: WO2009/157357
PCT Pub. Date: Dec. 30, 2009

(65) Prior Publication Data
US 2011/0110452 A1    May 12, 2011

(30) Foreign Application Priority Data

Jun. 25, 2008 (JP) .................. 2008-166379
Jul. 18, 2008 (JP) .................. 2008-186749
Jan. 22, 2009 (JP) .................. 2009-011721

(51) Int. Cl.
*H04B 7/02* (2006.01)
*H04L 1/02* (2006.01)

(52) U.S. Cl.
USPC .............................. 375/267; 375/299; 455/78

(58) Field of Classification Search
CPC  H01P 1/20336; H01P 27/088; H01P 29/1083
USPC ................... 375/267, 299; 455/78
See application file for complete search history.

(56) References Cited

U.S. PATENT DOCUMENTS 5,815,804 A     9/1998  Newell et al.
6,633,748 B1 * 10/2003  Watanabe et al. ............... 455/78
(Continued)

FOREIGN PATENT DOCUMENTS

EP     1768269 A1    3/2007
EP     1 976 133 A1  10/2008
(Continued)

OTHER PUBLICATIONS

Supplementary European Search Report dated Jun. 8, 2011, issued in Application No. 09770067.8.

*Primary Examiner* — Qutbuddin Ghulamali
(74) *Attorney, Agent, or Firm* — Sughrue Mion, PLLC

(57) ABSTRACT

A high-frequency circuit comprising first and second antenna terminals, a transmitting terminal and first and second receiving terminals for first and second communications systems, and first and second switch circuits each having a common terminal and at least first and second switching terminals; the first antenna terminal being connected to a common terminal of the first switch circuit, the transmitting terminal for the first communications system being connected to the first switching terminal of the first switch circuit, the second antenna terminal being connected to a common terminal of the second switch circuit, the transmitting terminal for the second communications system being connected to the first switching terminal of the second switch circuit, each first receiving terminal for the first and second communications systems being connected to the second switching terminal of the first switch circuit via a first receiving-side multiplexer circuit, each second receiving terminal for the first and second communications systems being connected to the second switching terminal of the second switch circuit via a second receiving-side multiplexer circuit.

21 Claims, 30 Drawing Sheets

(56) References Cited

U.S. PATENT DOCUMENTS

2003/0092398 A1    5/2003   Uriu et al.
2005/0048927 A1*   3/2005   Kemmochi et al. ............ 455/78
2006/0025171 A1    2/2006   Ly et al.
2007/0021080 A1*   1/2007   Kuriyama et al. ............ 455/132

FOREIGN PATENT DOCUMENTS

| JP | 2007-019939 A  | 1/2007 |
| JP | 2009-094713 A  | 4/2009 |
| WO | 2006/003959 A1 | 1/2006 |
| WO | 2007/083668 A1 | 7/2007 |

* cited by examiner

HIGH-FREQUENCY CIRCUIT, HIGH-FREQUENCY DEVICE, AND COMMUNICATIONS APPARATUS

FIELD OF THE INVENTION

The present invention relates to a high-frequency circuit commonly usable in at least two different communications systems between electronic or electric equipments, a high-frequency device having such high-frequency circuit, and a communications apparatus comprising it.

BACKGROUND OF THE INVENTION

Data communications by wireless LAN such as IEEE802.11 are now widely used, for instance, in personal computers (PCs), PC peripherals such as printers, hard disk drives and broadband routers, electronic apparatuses such as FAXs, refrigerators, standard television sets (SDTVs), high-definition television sets (HDTVs), digital cameras, digital video cameras and mobile phones, signal-transmitting means in automobiles and aircrafts, etc.

As the wireless LAN standard, IEEE802.11a uses an orthogonal frequency division multiplexing (OFDM) modulation system in a frequency band of 5 GHz, supporting high-speed data communications of maximum 54 Mbps. IEEE802.11b uses a direct sequence spread spectrum (DSSS) system in an industrial, scientific and medical (ISM) band of 2.4 GHz usable without a wireless license, supporting high-speed communications of 5.5 Mbps and 11 Mbps. IEEE802.11g uses the OFDM modulation system in a 2.4-GHz band like TFEE802.11b, supporting high-speed data communications of maximum 54 Mbps. WiMAX (IEEE 802.16-2004, IEEE 802.16e-2005, etc.) proposed as a high-speed wireless communications standard covering several kilometers of communications is expected as a technology for so-called last one mile of optical communications using three frequency bands of 2.5 GHz, 3.5 GHz and 5 GHz.

Important to high-frequency devices using pluralities of communications systems such as wireless LAN, WiMAX, etc. is how to separate transmitting and received signals in these communications systems. For example, WO 2006/003959 discloses a high-frequency circuit capable of performing diversity reception, comprising two dual-band antennas capable of transmitting and receiving signals for two communications systems (IEEE 802.11a and IEEE 802.11b) of different frequency bands, a high-frequency switch having four ports for switching connections to transmitting circuits and receiving circuits, a first multiplexer circuit disposed between one port of the high-frequency switch and the transmitting circuit, and a second multiplexer circuit disposed between the other port of the high-frequency switch and the receiving circuit.

Much attention is recently paid to wireless communications in MIMO (multiple-input, multiple-output) systems having excellent communications characteristics. The MIMO system requires that one communications system has pluralities of receiving terminals capable of simultaneously receiving signals independently. The term "MIMO" used herein includes slim (single-input, multiple-output). However, the high-frequency circuit described in WO 2006/003959 cannot handle a combination of multiband wireless communications and MIMO. Also, because wireless communications systems of a MIMO system have an increased number of circuit structures such as receiving terminals, etc. for one communications system, isolation is difficult between pluralities of communications systems, resulting in complicated circuit structures. Therefore, the use of the MIMO system in multiband wireless communications is extremely difficult. In the case of WiMAX handling particularly high transmission power, isolation among pluralities of communications systems is important to reduce transmission power loss.

OBJECT OF THE INVENTION

Accordingly, an object of the present invention is to provide a high-frequency circuit and a high-frequency device capable of handling different communications systems with high receiving sensitivity and suppressed transmission power loss, and a communications apparatus comprising it.

DISCLOSURE OF THE INVENTION

The first high-frequency circuit of the present invention comprises first and second antenna terminals, a transmitting terminal and first and second receiving terminals for a first communications system, a transmitting terminal and first and second receiving terminals for a second communications system, and first and second switch circuits each having a common terminal and at least first and second switching terminals;

the first antenna terminal being connected to a common terminal of the first switch circuit, and the transmitting terminal for the first communications system being connected to the first switching terminal of the first switch circuit;

the second antenna terminal being connected to a common terminal of the second switch circuit, and the transmitting terminal for the second communications system being connected to the first switching terminal of the second switch circuit;

the first receiving terminal for the first communications system and the first receiving terminal for the second communications system being connected to the second switching terminal of the first switch circuit via a first receiving-side multiplexer circuit; and the second receiving terminal for the first communications system and the second receiving terminal for the second communications system being connected to the second switching terminal of the second switch circuit via a second receiving-side multiplexer circuit.

The use of this structure in a dual-band, 1T2R (one-transmission, two-reception)-type, MIMO system makes it unnecessary to have multiplexer circuits between the transmitting terminal of the first communications system and the first antenna terminal, and between the transmitting terminal of the second communications system and the second antenna terminal, thereby reducing the transmission power loss of the first and second communications systems.

The second high-frequency circuit of the present invention comprises first and second antenna terminals, a transmitting terminal and first and second receiving terminals for a first communications system, a transmitting terminal and first and second receiving terminals for a second communications system, and first and second switch circuits each having a common terminal and first to third switching terminals;

the first antenna terminal being connected to the common terminal of the first switch circuit, and the transmitting terminal for the first communications system being connected to the first switching terminal of the first switch circuit;

the second antenna terminal being connected to the common terminal of the second switch circuit, and the transmitting terminal for the second communications system being connected to the first switching terminal of the second switch circuit;

the first receiving terminal for the first communications system being connected to the second switching terminal of the first switch circuit, and the first receiving terminal for the second communications system being connected to the third switching terminal of the first switch circuit; and the second receiving terminal for the first communications system being connected to the second switching terminal of the second switch circuit, and the second receiving terminal for the second communications system being connected to the third switching terminal of the second switch circuit.

The use of this structure in a dual-band, 1T2R-type MIMO system makes it unnecessary to have multiplexer circuits between the transmitting terminal of the first communications system and the first antenna terminal, and between the transmitting terminal of the second communications system and the second antenna terminal, thereby reducing the transmission power loss of the first and second communications systems. Also, because a multiplexer circuit need not be arranged between each receiving terminal and each antenna terminal, the receiving path loss is reduced.

The first high-frequency circuit preferably further comprises a transmitting terminal and first and second receiving terminals for the third communications system; the second switch circuit having a third switching terminal; the first and second receiving-side multiplexer circuits being triplexers; the first receiving terminal for the third communications system being connected to the second switching terminal of the first switch circuit via the first receiving-side multiplexer circuit; the second receiving terminal for the third communications system being connected to the second switching terminal of the second switch circuit via the second receiving-side multiplexer circuit; and the transmitting terminal for the third communications system being connected to the third switching terminal of the second switch circuit. This structure enables triple-band, 1T2R-type MIMO communications. In addition, the transmitting terminal for the third communications system can be connected to the third antenna terminal without interposing a multiplexer circuit. Accordingly, even when the high-frequency circuit comprises a transmitting terminal for the third communications system, the transmission power loss of the third communications system can be reduced.

The first or second high-frequency circuit preferably further comprises a third antenna terminal, a third receiving terminal for the first communications system, and a third receiving terminal for the second communications system; the third receiving terminal for the first communications system and the third receiving terminal for the second communications system being connected to the third antenna terminal via the third receiving-side multiplexer circuit. This structure enables dual-band, 1T3R (one-transmission, three-reception)-type MIMO communications. Because signals can be received from three antennas, improvement in the receiving sensitivity, a feature of the MIMO system, and the expansion of communications distance can be expected.

The first high-frequency circuit preferably further comprises a third antenna terminal, a third receiving-side multiplexer circuit, a third receiving terminal for the first communications system, a third receiving terminal for the second communications system, and a transmitting terminal and first to third receiving terminals for the third communications system; the first to third receiving-side multiplexer circuits being triplexers; the first receiving terminal for the third communications system being connected to the second switching terminal of the first switch circuit via the first receiving-side multiplexer circuit; the second receiving terminal for the third communications system being connected to the second switching terminal of the second switch circuit via the second receiving-side multiplexer circuit; the third antenna terminal being connected to a common terminal of the third switch circuit, the transmitting terminal for the third communications system being connected to the first switching terminal of the third switch circuit; and the third receiving terminals for the first to third communications systems being connected to the second switching terminal of the third switch circuit via the third receiving-side multiplexer circuit. This structure enables triple-band, 1T3R-type MIMO communications. Because signals can be received from three antennas in this structure, improvement in the receiving sensitivity, a feature of the MIMO system, and the expansion of communications distance can be expected. Further, the transmitting terminal for the third communications system can be connected to the third antenna terminal without interposing a multiplexer circuit. Accordingly, even when the high-frequency circuit comprises a transmitting terminal for the third communications system, the transmission power loss of the third communications system can be reduced.

In each of the above high-frequency circuits, a low-noise amplifier circuit is preferably connected to the receiving-side multiplexer circuit on the antenna terminal side. This structure reduces the number of necessary low-noise amplifier circuits, thereby miniaturizing the high-frequency circuit and the high-frequency device. Accordingly, this structure is suitable for multiband MIMO systems having many receiving terminals.

Each of the above high-frequency circuits preferably comprises a high-frequency amplifier circuit connected between the transmitting terminal for the first communications system and the first switch circuit; a first low-noise amplifier circuit connected between the first receiving terminal for the first communications system and the first switch circuit; a second low-noise amplifier circuit connected between the second receiving terminal for the first communications system and the second switch circuit; a first branching circuit having a common terminal connected to the high-frequency amplifier circuit; a second branching circuit having a common terminal connected to the transmitting terminal for the first communications system; and a third branching circuit having a common terminal connected to the first low-noise amplifier circuit; a fourth branching circuit having a common terminal connected to the first receiving terminal for the first communications system; a fifth branching circuit having a common terminal connected to the second low-noise amplifier circuit; and a sixth branching circuit having a common terminal connected to the second receiving terminal for the first communications system;

bandpass filter circuits being connected between the first branching terminal of the first branching circuit and the first branching terminal of the second branching circuit, between the second branching terminal of the first branching circuit and the second branching terminal of the second branching circuit, between the first branching terminal of the third branching circuit and the first branching terminal of the fourth branching circuit, between the second branching terminal of the third branching circuit and the second branching terminal of the fourth branching circuit, between the first branching terminal of the fifth branching circuit and the first branching terminal of the sixth branching circuit, and between the second branching terminal of the fifth branching circuit and the second branching terminal of the sixth branching circuit, respectively.

When two close frequency bands of 2.3-2.4 GHz and 2.5-2.7 GHz are handled as a single frequency band of 2.5 GHz, this structure can provide necessary attenuation characteristics with minimum loss as a bandpass filter for 2.3-2.4 GHz and 2.5-2.7 GHz. Also, a high-frequency amplifier circuit and a low-noise amplifier circuit can be used for both 2.3-2.4 GHz and 2.5-2.7 GHz, avoiding a complicated circuit structure.

Each of the above high-frequency circuits preferably comprises a high-frequency amplifier circuit connected between the transmitting terminal for the first communications system and the first switch circuit; a first low-noise amplifier circuit connected between the first receiving terminal for the first communications system and the first switch circuit; and a second low-noise amplifier circuit connected between the second receiving terminal for the first communications system and the second switch circuit;

tunable bandpass filter circuits being connected between the high-frequency amplifier circuit and the transmitting terminal for the first communications system, between the first low-noise amplifier circuit and the first receiving terminal for the first communications system, and between the second low-noise amplifier circuit and the second receiving terminal for the first communications system, respectively. When two close frequency bands of 2.3-2.4 GHz and 2.5-2.7 GHz are handled as a single, wide frequency band of 2.5-GHz band, this structure can provide necessary attenuation characteristics with a small number of bandpass filters as a bandpass filter for both 2.3-2.4 GHz and 2.5-2.7 GHz. Also, a high-frequency amplifier circuit and a low-noise amplifier circuit can be used for both 2.3-2.4 GHz and 2.5-2.7 GHz, avoiding a complicated circuit structure.

The high-frequency device of the present invention comprises an integral laminate comprising pluralities of dielectric layers having electrode patterns for any of the above high-frequency circuits, and devices mounted on the laminate. With the high-frequency circuit integrated in the laminate, the high-frequency device is miniaturized, thereby reducing insertion loss due to wiring resistance.

The above high-frequency device preferably comprises pluralities of bandpass filter circuits each having pluralities of linear resonator lines arranged in parallel in the laminate, all resonator lines of pluralities of bandpass filter circuits extending in the same direction. This structure reduces space loss for the arrangement of bandpass filter circuits, miniaturizing the laminate module. When the resonator lines of pluralities of bandpass filters all extending in the same direction are formed by a screen printing method, size unevenness due to blurring, etc. can be reduced, thereby suppressing the characteristic variation of bandpass filters.

The above high-frequency device preferably comprises pluralities of bandpass filter circuits each having pluralities of linear resonator lines arranged in parallel in the laminate, pluralities of bandpass filter circuits disposed in the same signal path being arranged adjacently in the longitudinal direction of the resonator lines via shielding structures comprising lines of grounded via-electrodes and strip-shaped electrodes, and the input and output terminals of each bandpass filter circuit being arranged at far ends of the resonator lines from the shielding structures. This structure miniaturizes the laminate module comprising bandpass filter circuits, while keeping isolation between the inputs and outputs of bandpass filters.

The high-frequency device according to one preferred embodiment of the present invention comprises an integral laminate comprising pluralities of dielectric layers having electrode patterns for the high-frequency circuit, and devices mounted on the laminate;

each multiplexer circuit having a first filter part passing signals for the first communications system and blocking signals for the second communications system, and a second filter part passing signals for the second communications system and blocking signals for the first communications system, both first and second filter parts being constituted by phase lines;

the phase lines of the first filter part being connected to a bandpass filter circuit passing signals for the first communications system, and the phase lines of the second filter part being connected to a bandpass filter circuit passing signals for the second communications system;

each phase line being formed by spirally connecting electrode patterns on pluralities of dielectric layers in a lamination direction; and a ground electrode being arranged between the spiral phase lines.

This structure miniaturizes the multiplexer circuit. With a ground electrode arranged between spiral phase lines, sufficient isolation is secured between the phase lines, resulting in excellent signal-separating functions. Further, because spirally formed phase lines have an increased inductance component, necessary line length can be reduced to obtain the desired phase angle, resulting in decreased conductor loss. Because spirally formed phase lines have an increased inductance component, the phase lines should be thick to keep matching at 50Ω. In this case, the conductor loss of transmission lines can be further reduced.

In the above high-frequency device, ground electrodes are preferably arranged such that they sandwich the spiral phase lines of the first filter part and the spiral phase lines of the second filter part in a lamination direction. With ground electrodes arranged above and below the spiral phase lines, the phase lines have good symmetry of impedance on the input side and output sides, making it easy to form the phase lines having impedance matching at 50Ω. Because upper and lower ground electrodes shield the phase lines, isolation from other circuits is improved, resulting in the improved attenuation characteristics of bandpass filters.

The communications apparatus of the present invention comprises the above high-frequency device. The above high-frequency device contributes to the miniaturization of communications apparatuses such as mobile communications apparatuses, personal computers, etc.

DESCRIPTION OF THE BEST MODE OF THE INVENTION

[1] High-Frequency Circuit

Figure 1:
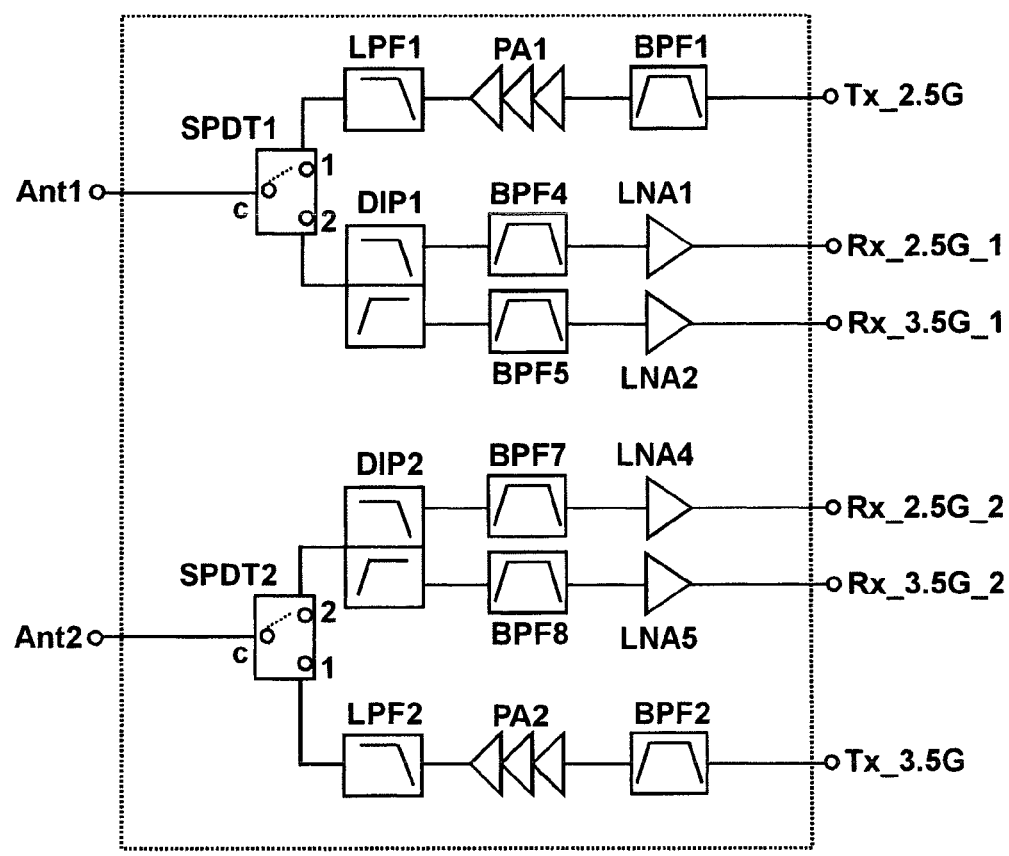
FIG. 1 is a block diagram showing a high-frequency circuit according to one embodiment of the present invention.

The high-frequency circuit of the present invention is usable for at least two wireless communications systems (particularly MIMO-type). This high-frequency circuit comprises pluralities of receiving terminals per one communications system, which are independently connected to separate antennas; signals received by one communications system being simultaneously outputtable to pluralities of receiving terminals. Specifically, the high-frequency circuit of the present invention comprises first and second antenna terminals; a transmitting terminal and first and second receiving terminals for a first communications system; a transmitting terminal and first and second receiving terminals for a second communications system; and first and second switch circuits each having a common terminal and at least first and second switching terminals. The first antenna terminal is connected to the common terminal of the first switch circuit, the second antenna terminal is connected to the common terminal of the second switch circuit, the first switching terminal of the first switch circuit is connected to the transmitting terminal for the first communications system, and the first switching terminal of the second switch circuit is connected to the transmitting terminal for the second communications system. This structure reduces signal transmission loss.

The specific structures of the high-frequency circuits of the present invention will be explained in detail below referring to the attached drawings, though the present invention is not restricted thereto. In the figures, elements having the same functions are provided with the same reference numerals. The following embodiments will be explained, taking for example a high-frequency circuit of a front-end module used in a wireless communications apparatus, in which the first communications system is a 2.5-GHz band WiMAX, the second communications system is a 3.5-GHz band WiMAX having a higher frequency band than that of the first communications system, and the third communications system is a 5-GHz band WiMAX having a higher frequency band than that of the second communications system, though the structure of the present invention is of course usable, for example, in wireless LAN operable in a 2.4-GHz band and a 5-GHz band, a combination of WiMAX and wireless LAN, etc., in addition to the above communications system. The following embodiments will also be explained with examples of a dual band or a triple band, but the present invention is not restricted thereto, but may be used for various multiband communications. Though the MIMO system will be explained with a 1T2R (one-transmission, two-reception) type or a 1T3R (one-transmission, three-reception) type, it should be noted that the numbers of transmitting terminals and receiving terminals per one communications system are not restrictive, and that the present invention is also usable in MIMO systems having more transmitting terminals and receiving terminals.

(1) First embodiment

FIG. 1 shows one example of dual-band, high-frequency circuits using a 1T2R-type MIMO system. This high-frequency circuit comprises first and second antenna terminals Ant1, Ant2; a transmitting terminal Tx_2.5G, a first receiving terminal Rx_2.5G_1 and a second receiving terminal Rx_2.5G_2 for a first communications system; a transmitting terminal Tx_3.5G, a first receiving terminal Rx_3.5G_1 and a second receiving terminal Rx_3.5G_2 for a second communications system; and first and second switch circuits SPDT1, SPDT2 each having a common terminal c and first and second switching terminals 1, 2. Each of the first and second switch circuits SPDT1, SPDT2 is a single-pole, dual-throw-type switch circuit though not restrictive, and it may further comprise a switching terminal.

The first switch circuit SPDT1 comprises a common terminal c connected to a first antenna terminal Ant1, a first switching terminal 1 connected to the transmitting terminal Tx_2.5G for the first communications system, and a second switching terminal 2 connected via a first receiving-side multiplexer circuit DIP1 to the first receiving terminal Rx_2.5G_1 for the first communications system and the first receiving terminal Rx_3.5G_1 for the second communications system. The first switch circuit SPDT1 switches the connection between the first antenna terminal Ant1 and transmitting and receiving paths.

The second switch circuit SPDT2 comprises a common terminal c connected to a second antenna terminal Ant2, a first switching terminal 1 connected to the transmitting terminal Tx_3.5G for the second communications system, and a second switching terminal 2 connected via a second receiving-side multiplexer circuit DIP2 to the second receiving terminal Rx_2.5G_2 for the first communications system and the second receiving terminal Rx_3.5G_2 for the second communications system. The second switch circuit SPDT2 switches the connection between the second antenna terminal Ant2 and the transmitting and receiving paths.

Connected between the first switching terminal 1 of the first switch circuit SPDT1 and the transmitting terminal Tx_2.5G for the first communications system are a lowpass filter circuit LPF1, a high-frequency amplifier circuit PA1 for amplifying transmitting signals, and a bandpass filter circuit BPF1 in this order from the first switching terminal 1. The bandpass filter circuit BPF1 prevents noises in unnecessary bands other than transmitting signals from being input to the high-frequency amplifier circuit PA1, and the lowpass filter circuit LPF1 suppresses harmonics generated by the high-frequency amplifier circuit PA1. Connected between the first switching terminal 1 of the second switch circuit SPDT2 and the transmitting terminal Tx_3.5G for the second communications system are a lowpass filter circuit LPF2, a high-frequency amplifier circuit PA2 for amplifying transmitting signals, and a bandpass filter circuit BPF2 in this order from the first switching terminal 1. The lowpass filter circuit LPF2 and the bandpass filter circuit BPF2 have the same functions as those of the lowpass filter circuit LPF1 and the bandpass filter circuit BPF1 adjacent to the high-frequency amplifier circuit PA1. Having the high-frequency amplifier circuits PA1, PA2 shown in FIG. 1, the high-frequency circuit can be highly integrated. The structure between the first switching terminal 1 of the first switch circuit SPDT1 and the transmitting terminal Tx_2.5G for the first communications system, and the structure between the first switching terminal 1 of the second switch circuit SPDT2 and the transmitting terminal Tx_3.5G for the second communications system may be omitted or modified depending on characteristics required.

Each of the first and second receiving-side multiplexer circuits DIP1, DIP2 is a diplexer constituted by a lowpass filter part passing the frequency band of the first communications system and blocking the frequency band of the second communications system, and a highpass filter part blocking the frequency band of the first communications system and passing the frequency band of the second communications system. Connected between the lowpass filter part of the first receiving-side multiplexer circuit DIP1 and the first receiving terminal Rx_2.5G_1 for the first communications system are a bandpass filter circuit BPF4, and a low-noise amplifier circuit LNA1 amplifying received signals for the first communications system in this order from DIP1. The bandpass filter circuit BPF4 prevents unnecessary signals including signals for the second communications system from being input to the low-noise amplifier circuit LNA1. Connected between the highpass filter part of the first receiving-side multiplexer circuit DIP1 and the first receiving terminal Rx_3.5G_1 for the second communications system are a bandpass filter circuit BPF5, and a low-noise amplifier circuit LNA2 amplifying received signals for the second communications system in this order from DIP1. The bandpass filter circuit BPF5 prevents unnecessary signals including signals for the first communications system from being input to the low-noise amplifier circuit LNA2. Connected between the lowpass filter part of the second receiving-side multiplexer circuit DIP2 and the second receiving terminal Rx_2.5G_2 for the first communications system are a bandpass filter circuit BPF7 and a low-noise amplifier circuit LNA4 in this order from DIP2, and connected between the highpass filter part of the second receiving-side multiplexer circuit DIP2 and the second receiving terminal Rx_3.5G_2 for the second communications system are a bandpass filter circuit BPF8 and a low-noise amplifier circuit LNA5 in this order from DIP2. Because these circuit arrangements and functions are the same as those of the circuits between the first receiving-side multiplexer circuit DIP1 and the first receiving terminal Rx_2.5G_1 for the first communications system and the first receiving terminal Rx_3.5G_1 for the second communications system, their explanation will be omitted. With the low-noise amplifier circuits LNA4, LNA5 as shown in FIG. 1, the high-frequency circuit can be highly integrated. It should be noted, however, that the structure between each of the above multiplexer circuits and each receiving terminal may be omitted or modified depending on necessary characteristics.

In the embodiment shown in FIG. 1, because the first receiving terminal Rx_2.5G_1 for the first communications system and the second receiving terminal Rx_2.5G_2 for the first communications system are connected to separate antennas independently, received signals for the first communications system can be simultaneously output to pluralities of receiving terminals without switching the antennas. Similarly, because the first receiving terminal Rx_3.5G_1 for the second communications system and the second receiving terminal Rx_3.5G_2 for the second communications system are connected to separate antennas independently, received signals for the second communications system can be simultaneously output to pluralities of receiving terminals without switching the antennas. Such a MIMO-type high-frequency circuit provides improved receiving sensitivity. In the embodiment shown in FIG. 1, because the transmitting terminal Tx_2.5G for the first communications system and the transmitting terminal Tx_3.5G for the second communications system, which are used in different frequency bands, are connected to separate antennas independently, no multiplexer circuits need be connected in transmitting paths, thereby avoiding transmitting signal loss due to the multiplexers.

(2) Second Embodiment

Figure 2:
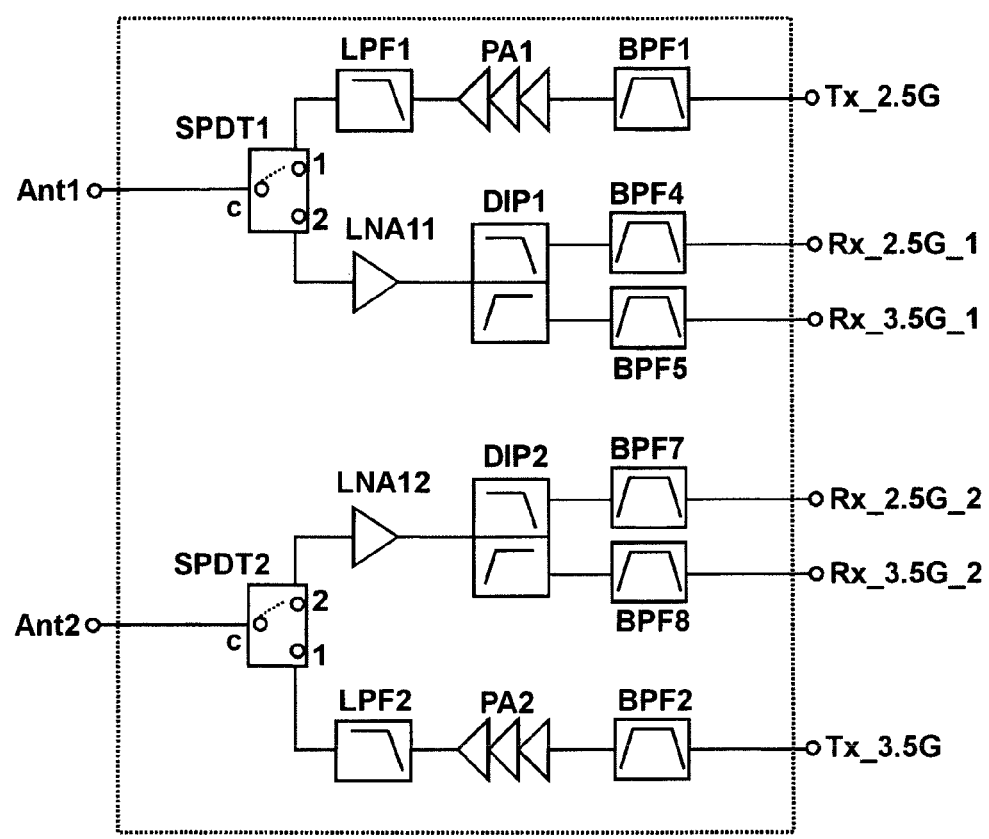
FIG. 2 is a block diagram showing a high-frequency circuit according to another embodiment of the present invention.

FIG. 2 shows another example of dual-band, high-frequency circuits using a 1T2R (one-transmission, two-reception)-type MIMO system. This high-frequency circuit differs from the high-frequency circuit according to the first embodiment, in the structures between the second switching terminal 2 of the first switch circuit SPDT1 and the first receiving terminal Rx_2.5G_1 for the first communications system and the first receiving terminal Rx_3.5G_1 for the second communications system, and in the structures between the second switching terminal 2 of the second switch circuit SPDT2 and the second receiving terminal Rx_2.5G_2 for the first communications system and the second receiving terminal Rx_3.5G_2 for the second communications system. Specifically, in the high-frequency circuit shown in FIG. 2, a low-noise amplifier circuit LNA11 is connected between the second switching terminal 2 of the first switch circuit SPDT1 and the first receiving-side multiplexer circuit DIP1, and a low-noise amplifier circuit LNA12 is connected between the second switching terminal 2 of the second switch circuit SPDT2 and the second receiving-side multiplexer circuit DIP2. Because the other structures are the same as those in the first embodiment, their explanation will be omitted.

In the structure shown in FIG. 2, low-noise amplifier circuits connected to the receiving-side multiplexer circuits on the antenna terminal side are commonly used by the first and second communications systems, thereby reducing the number of necessary low-noise amplifier circuits, and thus making the high-frequency circuit and device smaller. Used in the embodiment shown in FIG. 2 are wide-band, low-noise amplifier circuits capable of amplifying signals for the first communications system and signals for the second communications system. To block low-frequency unnecessary signals, a highpass filter circuit may be disposed on the input side of the low-noise amplifier circuit LNA11 (for example, between the first switch circuit SPDT1 and the low-noise amplifier circuit LNA11). A highpass filter circuit suffering smaller insertion loss than that of a bandpass filter circuit is preferable as a filter arranged on the input side of the low-noise amplifier circuit. In place of the first and second receiving-side multiplexer circuits DIP1, DIP2, a single-pole, double-throw switch circuit may be used. In this case, the switch circuit has a common terminal on the side of the low-noise amplifier circuit and switching terminals on the side of the receiving terminals.

(3) Third Embodiment

Figure 3:
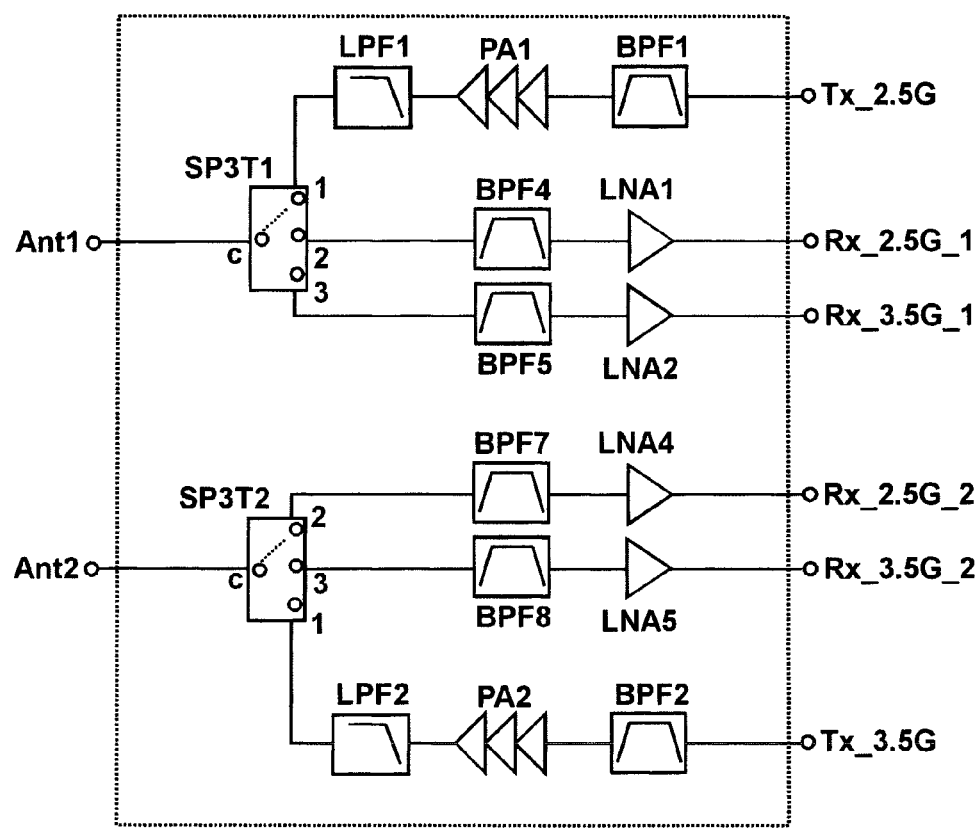
FIG. 3 is a block diagram showing a high-frequency circuit according to a further embodiment of the present invention.

FIG. 3 shows a still further example of dual-band, high-frequency circuits using a 1T2R (one-transmission, two-reception)-type MIMO system. In this high-frequency circuit, each of first and second switch circuits SP3T1, SP3T2 is a single-pole, triple-throw type having a common terminal and first to third switching terminals 1-3, the second and third switching terminals 2, 3 of the first switch circuit SP3T1 being connected to the first receiving terminal Rx_2.5G_1 for the first communications system and the first receiving terminal Rx_3.5G_1 for the second communications system, respectively, and the second and third switching terminals 2, 3 of the second switch circuit SP3T2 being connected to the second receiving terminal Rx_2.5G_2 for the first communications system and the second receiving terminal Rx_3.5G_2 for the second communications system, respectively. Namely, the first receiving terminal Rx_2.5G_1 for the first communications system and the first receiving terminal Rx_3.5G_1 for the second communications system are connected to the first switch circuit SP3T1 without passing through a multiplexer circuit, and the second receiving terminal Rx_2.5G_2 for the first communications system and the second receiving terminal Rx_3.5G_2 for the second communications system are connected to the second switch circuit SP3T2 without passing through a multiplexer circuit. Each of the first and second switch circuits SP3T1, SP3T2 is operated to switch a receiving path for the first communications system and a receiving path for the second communications system. Because the high-frequency circuit in the third embodiment is the same as that in the first embodiment except for these structures, explanation will be omitted on the other structures.

In the third embodiment, among three switching terminals of each switch circuit SP3T1, SP3T2, one switching terminal 1 is connected to a transmitting path, and two switching terminals 2, 3 are used to switch two receiving paths. Because the transmitting terminal Tx_2.5G for the first communications system and the transmitting terminal Tx_3.5G for the second communications system in different frequency bands are connected to separate antennas independently, a multiplexer circuit need not be disposed in the transmitting path, avoiding signal transmission loss due to the multiplexer circuit. Also, because a multiplexer circuit is not necessary in the receiving path, too, the signal receiving loss can be reduced.

(4) Fourth Embodiment

Figure 4:
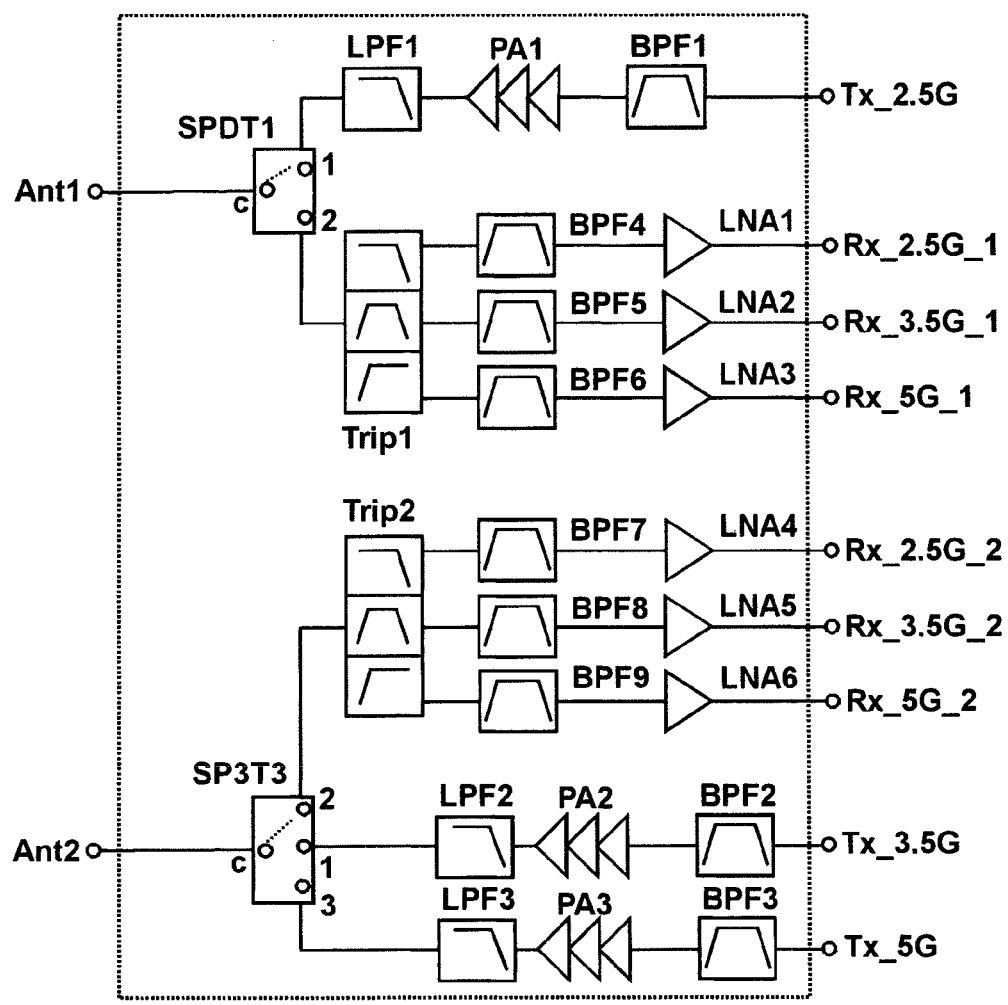
FIG. 4 is a block diagram showing a high-frequency circuit according to a still further embodiment of the present invention.

FIG. 4 shows one example of triple-band, high-frequency circuits using a 1T2R (one-transmission, two-reception)-type MIMO system. This high-frequency circuit can transmit and receive signals not only for the first and second communications systems shown in FIG. 1, etc., but also for a third communications system. Namely, in addition to the structure shown in FIG. 1, it comprises a transmitting terminal Tx_5G and first and second receiving terminals Rx_5G_1, Rx_5G_2 for the third communications system. It further comprises as a second switch circuit a single-pole, triple-throw-type switch circuit SP3T3 having a third switching terminal 3. Triplexers are used as first and second receiving-side multiplexer circuits Trip1, Trip2 in place of diplexers. The first receiving terminal Rx_5G_1 for the third communications system is connected to the second switching terminal 2 of the first switch circuit SPDT1 via the first receiving-side multiplexer circuit Trip1, and the second receiving terminal Rx_5G_2 for the third communications system is connected to the second switching terminal 2 of the second switch circuit SP3T3 via the second receiving-side multiplexer circuit Trip2. The transmitting terminal Tx_5G for the third communications system is connected to the third switching terminal 3 of the second switch circuit SP3T3. The first receiving terminals Rx_2.5G_1, Rx_3.5G_1, Rx_5G_1 for the first to third communications systems are connected to a first antenna terminal Ant1 via the first receiving-side multiplexer circuit Trip1, which is a triplexer, and the first switch circuit SPDT1, the second receiving terminals Rx_2.5G_2, Rx_3.5G_2, Rx_5G_2 for the first to third communications systems are connected to a second antenna terminal Ant2 via the second receiving-side multiplexer circuit Trip2, which is a triplexer, and the second switch circuit SP3T3. Among three switching terminals of the second switch circuit SP3T3, one switching terminal is connected to a receiving path, and two switching terminals are used to switch transmitting paths. Because the first receiving terminals Rx_2.5G_1, Rx_3.5G_1, Rx_5G_1 and the second receiving terminals Rx_2.5G_2, Rx_3.5G_2, Rx_5G_2 for the first to third communications systems are connected to separate antennas Ant1, Ant2 independently, received signals for the communications systems can be simultaneously output to pluralities of receiving terminals without switching the antennas. Like the transmitting terminals Tx_2.5G, Tx_3.5G for the first and second communications systems, the transmitting terminal Tx_5G for the third communications system is connected to the second antenna terminal Ant2 without passing through a multiplexer circuit, avoiding signal transmission loss due to the multiplexer circuit even in the third communications system.

Each triplexer used for the first and second receiving-side multiplexer circuits Trip1, Trip2 is constituted by a lowpass filter part passing the frequency band of the first communications system and blocking the frequency bands of the second and third communications systems, a bandpass filter part passing the frequency band of the second communications system and blocking the frequency bands of the first and third communications systems, and a highpass filter part passing the frequency band of the third communications system and blocking the frequency bands of the first and second communications systems. It should be noted, however, that the triplexer is not restricted to have the above structure, but may be constituted by, for example, three bandpass filter parts each passing each frequency band of the first to third communications systems.

In the structure shown in FIG. 4, connected between the highpass filter part of the first receiving-side multiplexer circuit Trip 1 and the first receiving terminal Rx_5G_1 for the third communications system are a bandpass filter circuit BPF6, and a low-noise amplifier circuit LNA3 for amplifying received signals for the third communications system in this order from Trip1. Likewise, connected between the highpass filter part of the second receiving-side multiplexer circuit Trip2 and the second receiving terminal Rx_5G_2 for the third communications system are a bandpass filter circuit BPF9, and a low-noise amplifier circuit LNA6 for amplifying received signals for the third communications system in this order from Trip2. Because other structures than those described above in the first and second communications systems are the same as shown in FIG. 1, their explanation will be omitted. In place of the transmitting terminal Tx_2.5G for the first communications system, the transmitting terminal Tx_3.5G for the second communications system or the transmitting terminal Tx_5G for the third communications system may be connected to the first switching terminal of the first switch circuit SPDT1. In this case, the remaining two transmitting terminals may be connected to the second switch circuit SP3T3. In place of the first multiplexer circuit Trip 1 and/or the second multiplexer circuit Trip2, a single-pole, triple-throw-type switch circuit may be used. In this case, three switching terminals of the single-pole, triple-throw-type switch circuit may be connected to the receiving terminals of the first to third communications systems.

(5) Fifth Embodiment

Figure 5:
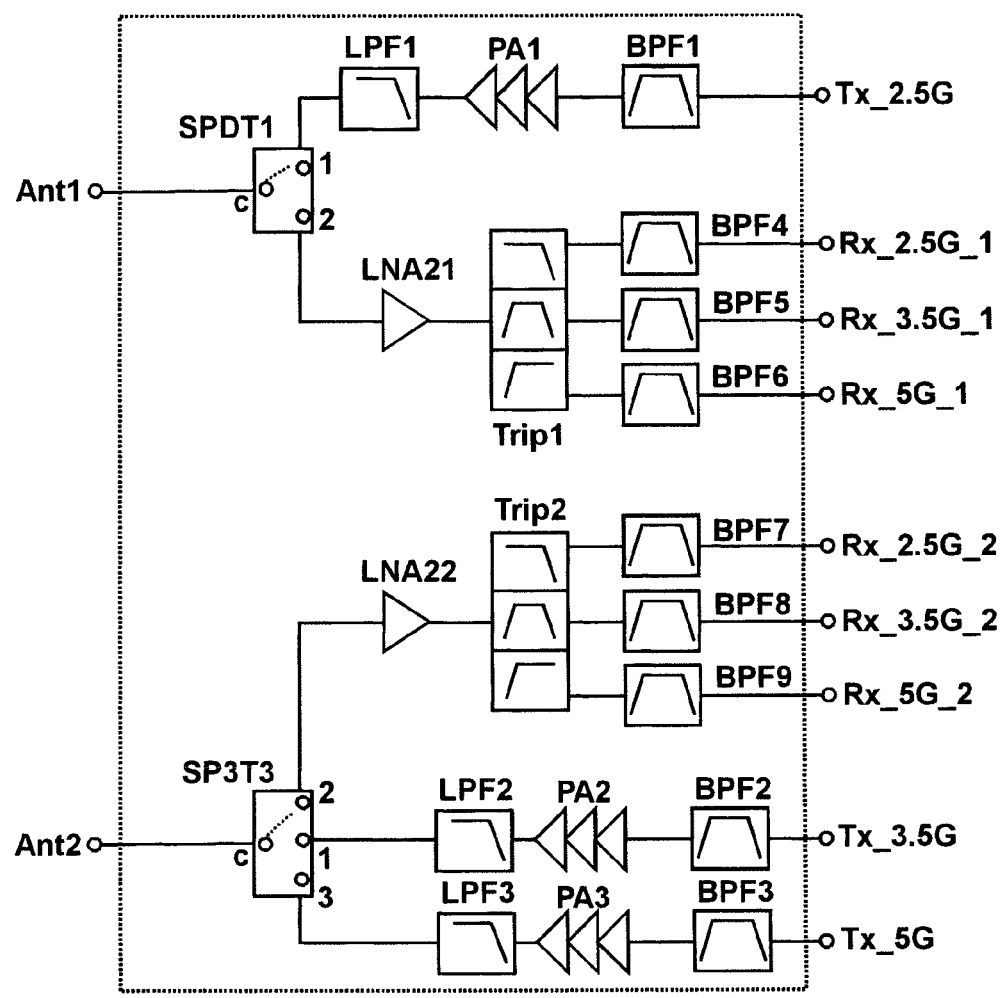
FIG. 5 is a block diagram showing a high-frequency circuit according to a still further embodiment of the present invention.

FIG. 5 shows another example of triple-band high-frequency circuits using a 1T2R (one-transmission, two-reception)-type MIMO system. This high-frequency circuit differs from the high-frequency circuit in the fourth embodiment shown in FIG. 4, in that the low-noise amplifier circuits LNA1, LNA2, LNA3 between the second switching terminal 2 of the first switch circuit SPDT1 and the first receiving terminals Rx_2.5G_1, Rx_3.5G_1, Rx_5G_1 for the first to third communications systems are replaced by a low-noise amplifier circuit LNA21 between the second switching terminal 2 of the first switch circuit SPDT1 and the first receiving-side multiplexer circuit Trip1, and that the low-noise amplifier circuits LNA4, LNA5, LNA6 between the second switching terminal 2 of the second switch circuit SP3T3 and the second receiving terminals Rx_2.5G_2, Rx_3.5G_2, Rx_5G_2 for the first to third communications systems are replaced by a low-noise amplifier circuit LNA22 between the second switching terminal 2 of the second switch circuit SP3T3 and the second receiving-side multiplexer circuit Trip2. Because the other structures are the same as in the fourth embodiment, their explanation will be omitted.

In the structure shown in FIG. 5, because one low-noise amplifier circuit is connected to the antenna terminal side of the receiving-side multiplexer circuit such that it is commonly used for the first to third communications systems, the number of necessary low-noise amplifier circuits is reduced, making the high-frequency circuit and device smaller. In the fifth embodiment, wideband, low-noise amplifier circuits capable of amplifying signals for the first to third communications systems are used. To the input side of the low-noise amplifier circuit LNA21 (for example, between the first switch circuit SPDT1 and the low-noise amplifier circuit LNA21), a highpass filter circuit for blocking unnecessary low-frequency signals may be added. Because a highpass filter circuit suffers smaller insertion loss than a bandpass filter circuit, the highpass filter circuit is preferable as a filter arranged on the input side of the low-noise amplifier circuit.

Figure 6:
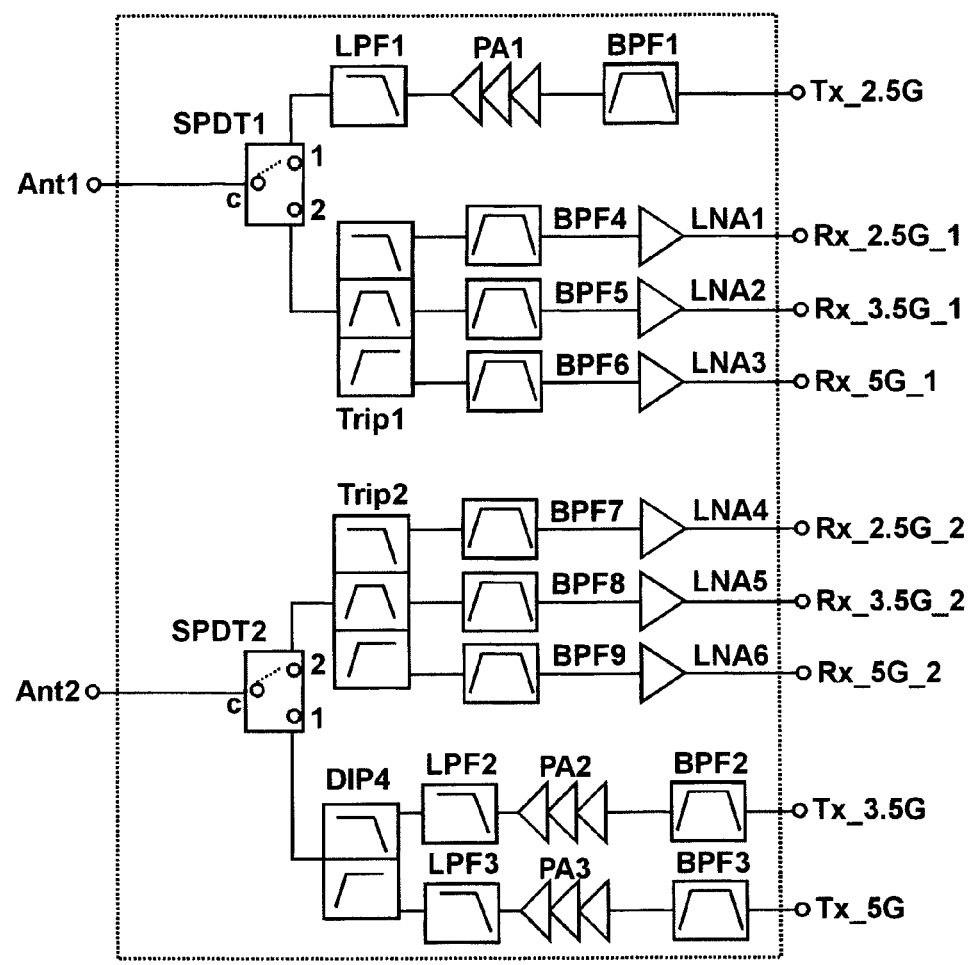
FIG. 6 is a block diagram showing a high-frequency circuit according to a still further embodiment of the present invention.

When the loss of transmitting signals need only be suppressed for one of the first to third communications systems, the structure shown in FIG. 6, for example, may be used. This structure is the same as shown in FIG. 4, except that the transmitting terminal Tx_3.5G for the second communications system and the transmitting terminal Tx_5G for the third communications system are connected to the first switching terminal of the second switch circuit SPDT2 of a single-pole, double-throw type via the multiplexer circuit DIP4, which is a diplexer. Even with such structure, signal transmission loss can be suppressed in the first communications system. The structure shown in FIG. 6 is suitable, when the suppression of signal transmission loss is more important in the first communications system than in other communications systems.

Figure 7:
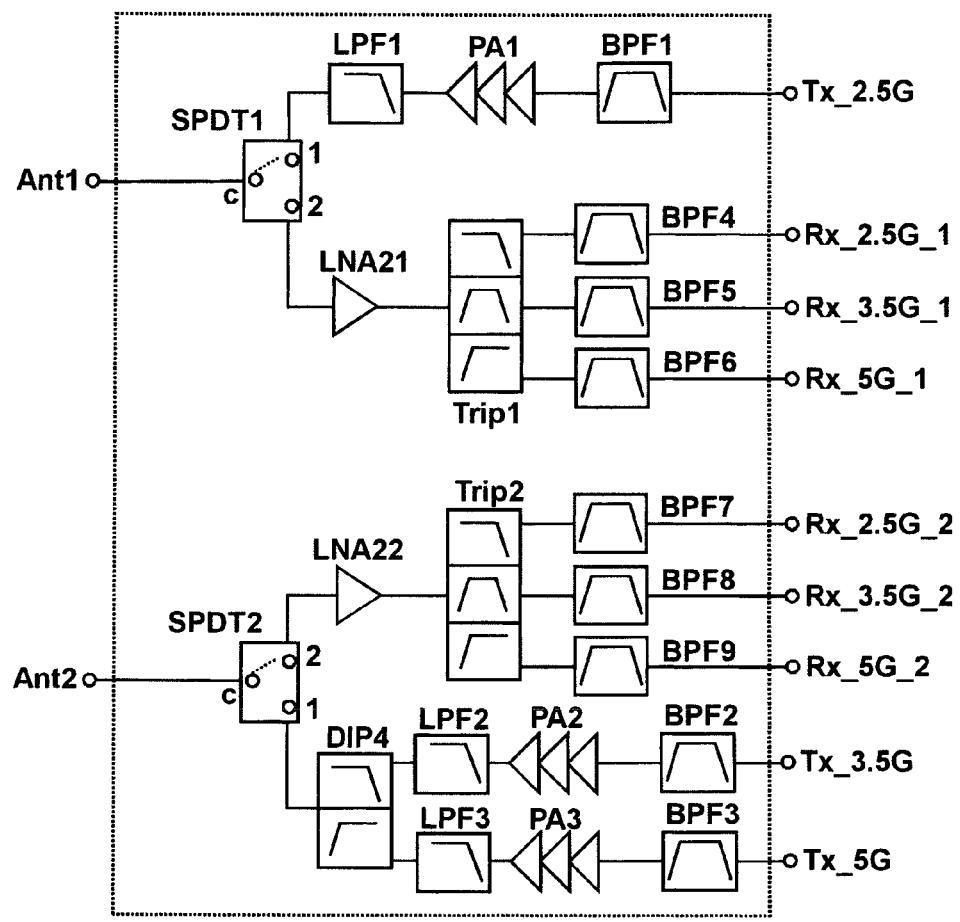
FIG. 7 is a block diagram showing a high-frequency circuit according to a still further embodiment of the present invention.

The arrangement of low-noise amplifier circuits shown in FIG. 6 may be changed to that shown in FIG. 7. The high-frequency circuit shown in FIG. 7 differs from that shown in FIG. 6, in that the low-noise amplifier circuits LNA1, LNA2, LNA3 between the second switching terminal 2 of the first switch circuit SPDT1 and the first receiving terminals Rx_2.5G_1, Rx_3.5G_1, Rx_5G_1 for the first to third communications systems are replaced by a low-noise amplifier circuit LNA21 between the second switching terminal 2 of the first switch circuit SPDT1 and the first receiving-side multiplexer circuit Trip 1, and that the low-noise amplifier circuits LNA4, LNA5, LNA6 between the second switching terminal 2 of the second switch circuit SP3T3 and the second receiving terminals Rx_2.5G_2, Rx_3.5G_2, Rx_5G_2 for the first to third communications systems are replaced by a low-noise amplifier circuit LNA22 between the second switching terminal 2 of the second switch circuit SP3T3 and the second receiving-side multiplexer circuit Trip2. Because the other structures are the same as shown in FIG. 6, their explanation will be omitted. Because such arrangement of low-noise amplifier circuits provides the same effects as in the embodiment shown in FIG. 6, their explanation will be omitted.

Figure 8:
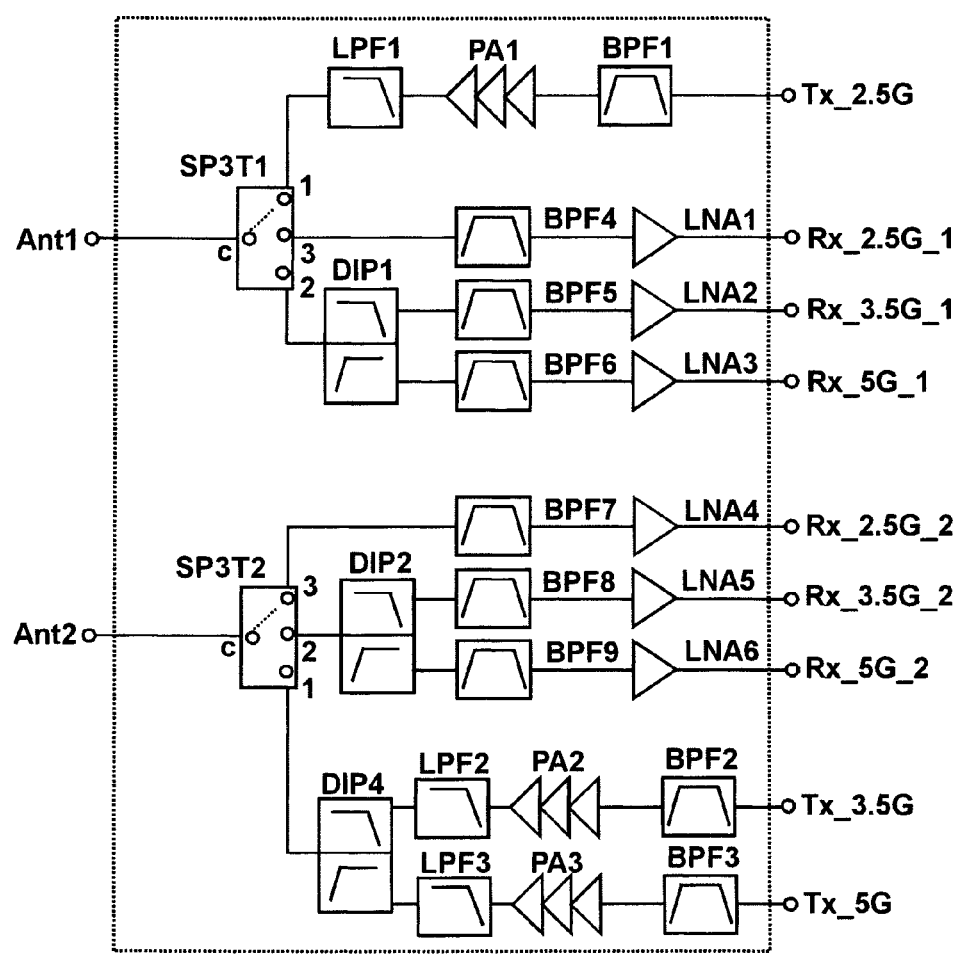
FIG. 8 is a block diagram showing a high-frequency circuit according to a still further embodiment of the present invention.

FIG. 8 shows an example of modified connections on the receiving side. The structure shown in FIG. 8 differs from that shown in FIG. 6, in that a diplexer is used in place of the triplexer for the receiving-side multiplexer circuit, and that a single-pole, triple-throw-type switch circuit is used in place of the single-pole, double-throw switch circuit for the first and second switch circuits. The first switch circuit SP3T1 of a single-pole, triple-throw type has a third switching terminal 3 connected to the first receiving terminal Rx__2.5G__1 for the first communications system, and a second switching terminal 2 connected to the first receiving terminal Rx__3.5G__1 for the second communications system and the first receiving terminal Rx__5G__1 for the third communications system via the first receiving-side multiplexer circuit DIP1. Likewise, The second switch circuit SP3T2 of a single-pole, triple-throw type has a third switching terminal 3 connected to the second receiving terminal Rx__2.5G__2 for the first communications system, and a second switching terminal 2 connected to the second receiving terminal Rx__3.5G__2 for the second communications system and the second receiving terminal Rx__5G__2 for the third communications system via the second receiving-side multiplexer circuit DIP2. Namely, among three communications systems, the receiving terminals of two communications systems are connected to a diplexer, and the receiving terminal of the remaining one communications system is connected to a switch circuit without passing through a diplexer (multiplexer circuit). This structure can reduce the loss of received signals in the communications systems connected to the switch circuit without a diplexer (multiplexer circuit). The receiving terminal connected to the switch circuit without a diplexer (multiplexer circuit) may be the receiving terminal of the second or third communications system in place of the receiving terminal of the first communications system. The other structures are the same as those shown in FIG. 6.

(6) Sixth Embodiment

Figure 9:
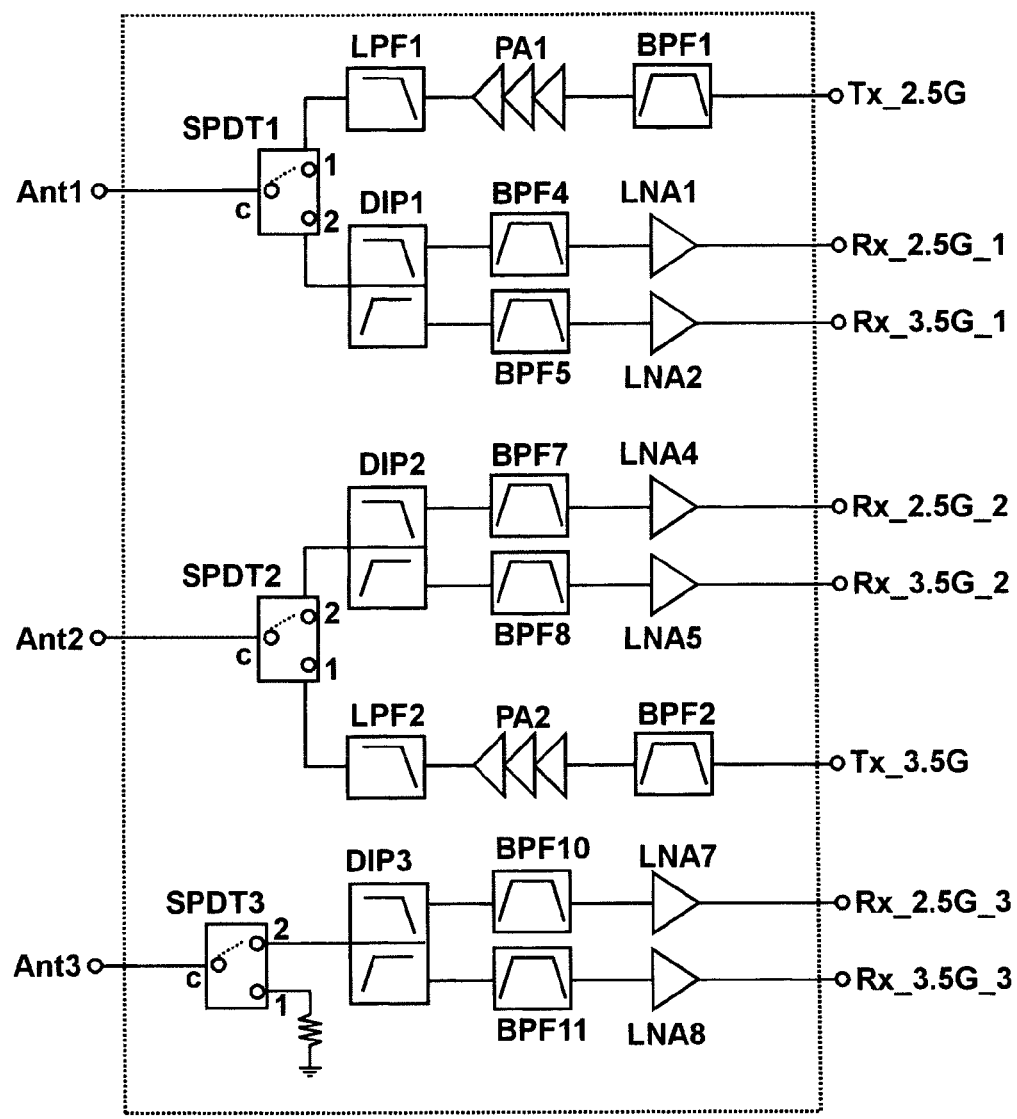
FIG. 9 is a block diagram showing a high-frequency circuit according to a still further embodiment of the present invention.

FIG. 9 shows one example of dual-band, high-frequency circuits using a 1T3R (one-transmission, three-reception)-type MIMO system. This high-frequency circuit comprises, in addition to the structure shown in FIG. 1, a third antenna terminal Ant3, a third receiving terminal Rx__2.5G__3 for the first communications system, and a third receiving terminal Rx__3.5G__3 for the second communications system, the third receiving terminal Rx__2.5G__3 for the first communications system and the third receiving terminal Rx__3.5G__3 for the second communications system being connected to the third antenna terminal via a third receiving-side multiplexer circuit DIP3. Connected between the lowpass filter part of the third receiving-side multiplexer circuit DIP3 and the third receiving terminal Rx__2.5G__3 for the first communications system are a bandpass filter circuit BPF10 and a low-noise amplifier circuit LNA7 in this order from DIP3, and connected between the highpass filter part of the third receiving-side multiplexer circuit DIP3 and the third receiving terminal Rx__3.5G__3 for the second communications system are a bandpass filter circuit BPF11 and a low-noise amplifier circuit LNA8 in this order from DIP3. Because each of the first and second communications systems has three receiving terminals connected to separate antennas terminals, received signals for the first and second communications systems can be simultaneously output to three receiving terminals without switching the antennas. A high-frequency circuit having such MIMO system has further improved receiving sensitivity.

In the embodiment shown in FIG. 9, a third switch circuit SPDT3 of a single-pole, double-throw type disposed between the third antenna terminal Ant3 and the third receiving-side multiplexer circuit DIP3 has a common terminal c connected to the third antenna terminal Ant3, a second switching terminal 2 connected to the third receiving-side multiplexer circuit DIP3, and a first switching terminal 1 grounded via a terminal resistance, to control the connection of the third antenna terminal Ant3 to the third receiving-side multiplexer circuit DIP3. Such third switch circuit SPDT3 may be omitted, or changed to a switch circuit having the other structure. In addition, in place of the third receiving-side multiplexer circuit DIP3, a single-pole, double-throw switch circuit may be connected to switch the third receiving terminal Rx__2.5G__3 for the first communications system and the third receiving terminal Rx__3.5G__3 for the second communications system.

(7) Seventh Embodiment

Figure 10:
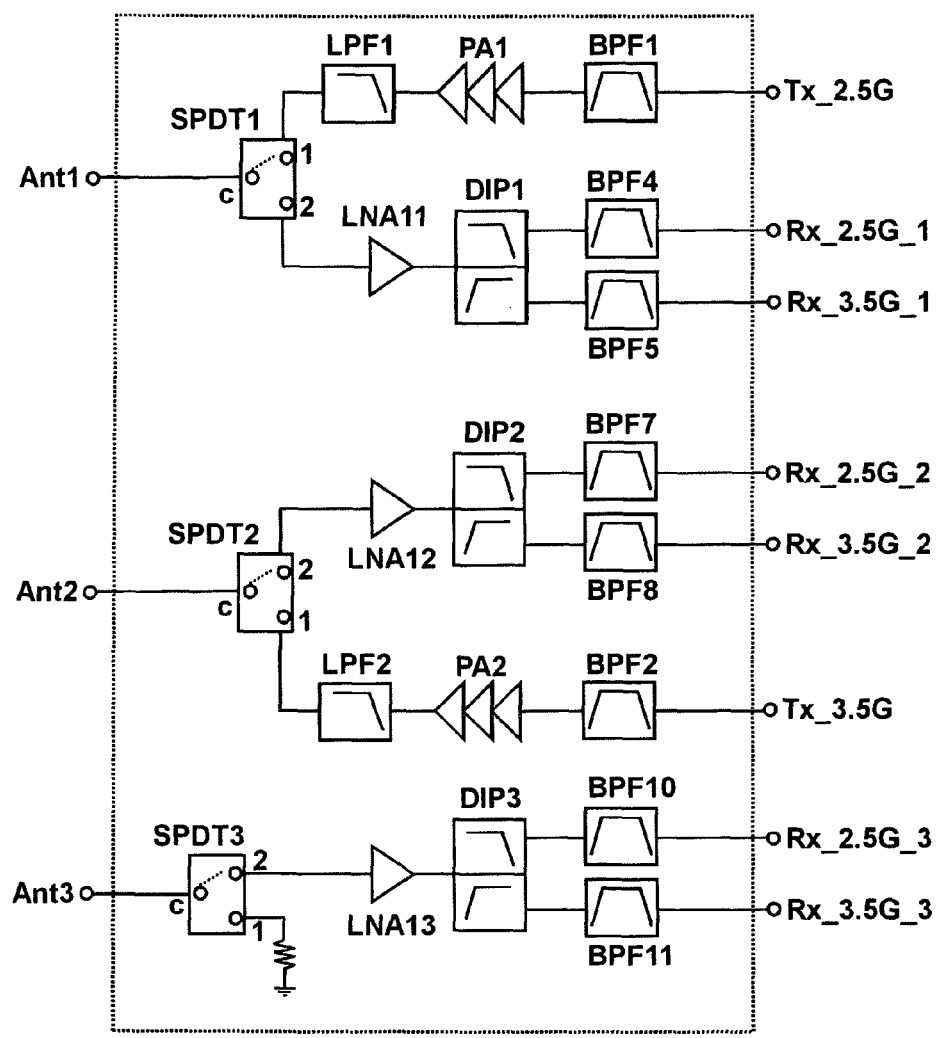
FIG. 10 is a block diagram showing a high-frequency circuit according to a still further embodiment of the present invention.

FIG. 10 shows a structure in which a low-noise amplifier circuit commonly used for the first and second communications systems is connected between each switch circuit and each receiving-side multiplexer circuit as in the second embodiment, in the high-frequency circuit shown in FIG. 9. Specifically, a low-noise amplifier circuit LNA11 is connected between the second switching terminal 2 of the first switch circuit SPDT1 and the first receiving-side multiplexer circuit DIP1, a low-noise amplifier circuit LNA12 is connected between the second switching terminal 2 of the second switch circuit SPDT2 and the second receiving-side multiplexer circuit DIP2, and a low-noise amplifier circuit LNA13 is connected between the second switching terminal 2 of the third switch circuit SPDT3 and the third receiving-side multiplexer circuit DIP3. Such arrangement of low-noise amplifier circuits on the antenna terminal side of the receiving-side multiplexer circuits reduces the number of necessary low-noise amplifier circuits, making the high-frequency circuit and device smaller. In this case, the use of a 1T3R-type MIMO system is particularly effective, because it increases the number of receiving paths.

(8) Eighth Embodiment

Figure 11:
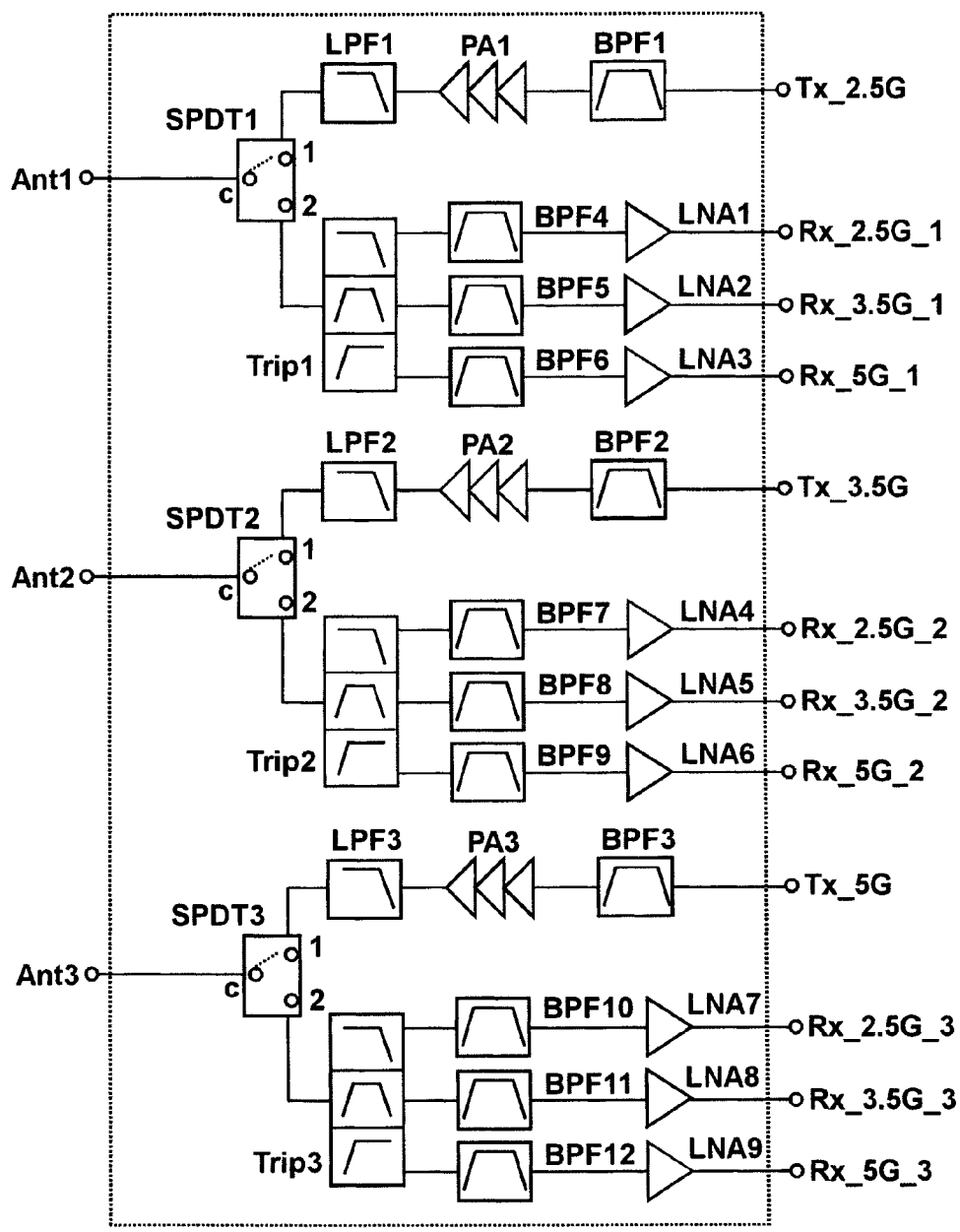
FIG. 11 is a block diagram showing a high-frequency circuit according to a still further embodiment of the present invention.

FIG. 11 shows one example of triple-band, high-frequency circuits, which can be used for communications in a 1T3R-type MIMO system as in the sixth embodiment. This high-frequency circuit comprises first and second signal paths connected to first and second antenna terminals Ant1, Ant2, and a third signal path connected to a third antenna terminal Ant3. Each of the first and second signal paths has the same structure as that of signal path connected to the first antenna terminal Ant1 as shown in FIG. 4, and the third signal path has a third switch circuit SPDT3 connected to the third antenna terminal Ant3. Connected between the first switching terminal 1 of the third switch circuit SPDT3 and the transmitting terminal Tx__5G for the third communications system are a lowpass filter circuit LPF3, a high-frequency amplifier circuit PA3, and a bandpass filter circuit BPF3 in this order from SPDT3. The second switching terminal 2 of the third switch circuit SPDT3 is connected to the third receiving-side multiplexer circuit Trip3. Connected between a lowpass filter part of the third receiving-side multiplexer circuit Trip3 and the third receiving terminal Rx_2.5G_3 for the first communications system are a bandpass filter circuit BPF10 and a low-noise amplifier circuit LNA7 in this order from Trip3; connected between a bandpass filter part of the third receiving-side multiplexer circuit Trip3 and the third receiving terminal Rx_3.5G_3 for the second communications system are a bandpass filter circuit BPF11 and a low-noise amplifier circuit LNA8 in this order from Trip3; and connected between a highpass filter part of the third receiving-side multiplexer circuit Trip3 and the third receiving terminal Rx_5G_3 for the third communications system are a bandpass filter circuit BPF 12 and a low-noise amplifier circuit LNA9 in this order from Trip3.

In the eighth embodiment, Each of the first to third communications systems has three receiving terminals connected to separate antennas terminals, so that received signals for the first to third communications systems can be simultaneously output to three receiving terminals without switching the antennas. With the high-frequency circuit of such a MIMO system, receiving sensitivity is further improved. Because transmitting terminals for the first to third communications systems are connected to separate antennas independently without multiplexer circuits, each communications system has reduced signal transmission loss.

(9) Ninth Embodiment

Figure 12:
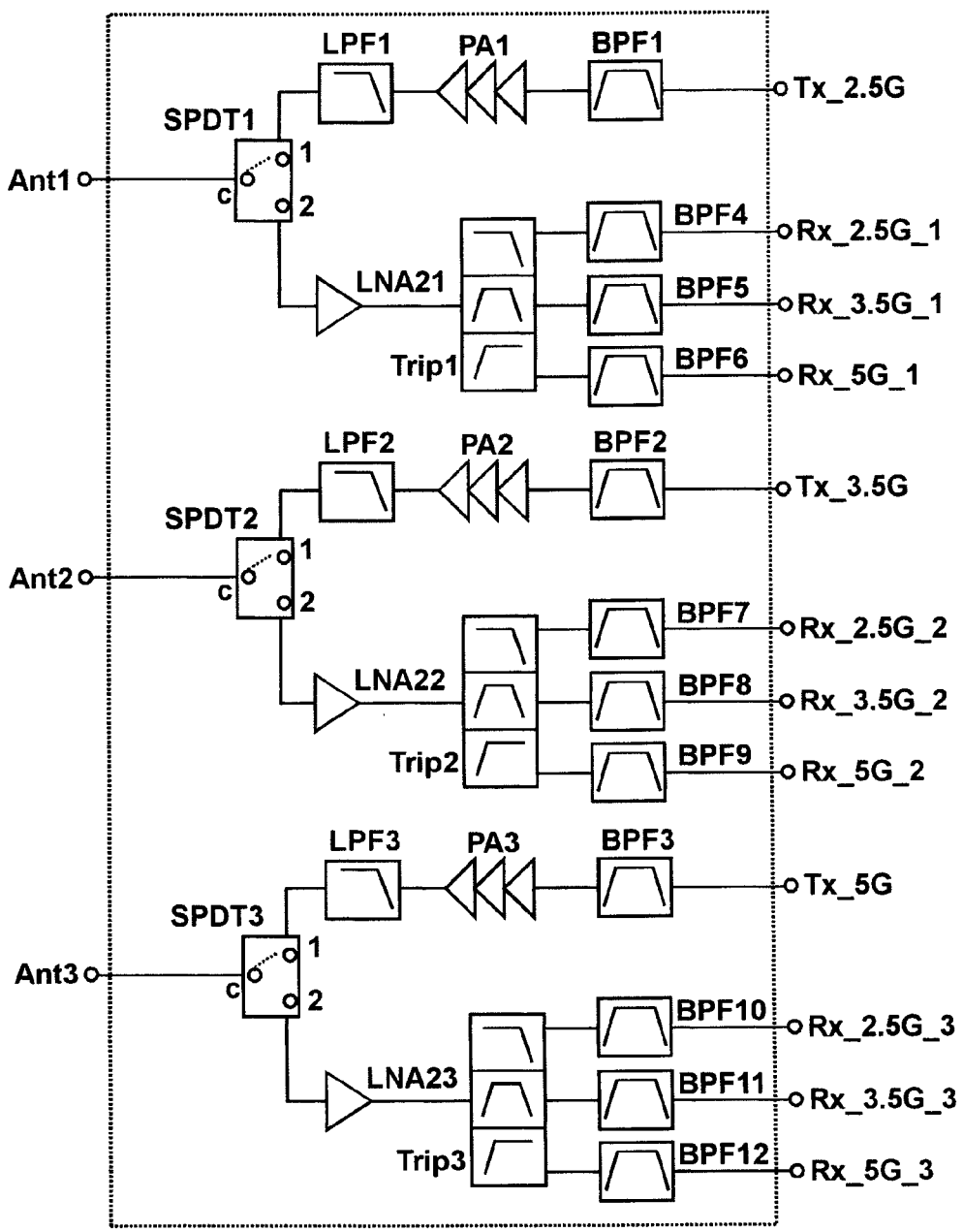
FIG. 12 is a block diagram showing a high-frequency circuit according to a still further embodiment of the present invention.

FIG. 12 shows one example of triple-band, high-frequency circuits using a 1T3R-type MIMO system. This high-frequency circuit differs from the high-frequency circuit in the eighth embodiment shown in FIG. 11, in that low-noise amplifier circuits LNA1, LNA2, LNA3 between the second switching terminal 2 of the first switch circuit SPDT1 and the first receiving terminals Rx_2.5G_1, Rx_3.5G_1, Rx_5G_1 for the first to third communications systems are replaced by one low-noise amplifier circuit LNA21 between the second switching terminal 2 of the first switch circuit SPDT1 and the first receiving-side multiplexer circuit Trip1, that low-noise amplifier circuits LNA4, LNA5, LNA6 between the second switching terminal 2 of the second switch circuit SP3T2 and the second receiving terminals Rx_2.5G_2, Rx_3.5G_2, Rx_5G_2 for the first to third communications systems are replaced by one low-noise amplifier circuit LNA22 between the second switching terminal 2 of the second switch circuit SP3T2 and the second receiving-side multiplexer circuit Trip2, and that low-noise amplifier circuits LNA7, LNA8, LNA9 between the second switching terminal 2 of the third switch circuit SP3T3 and the third receiving terminals Rx_2.5G_3, Rx_3.5G_3, Rx_5G_3 for the first to third communications systems are replaced by one low-noise amplifier circuit LNA23 between the second switching terminal 2 of the third switch circuit SP3T3 and the third receiving-side multiplexer circuit Trip3. With low-noise amplifier circuits arranged on the antenna terminal side of the receiving-side multiplexer circuits, the number of necessary low-noise amplifier circuits can be reduced, resulting in the miniaturization of the high-frequency circuit and device. In this case, the use of a 1T3R-type MIMO system is particularly effective, because it drastically increases receiving paths. Because the other structures are the same as in the eighth embodiment, their explanation will be omitted.

Figure 13:
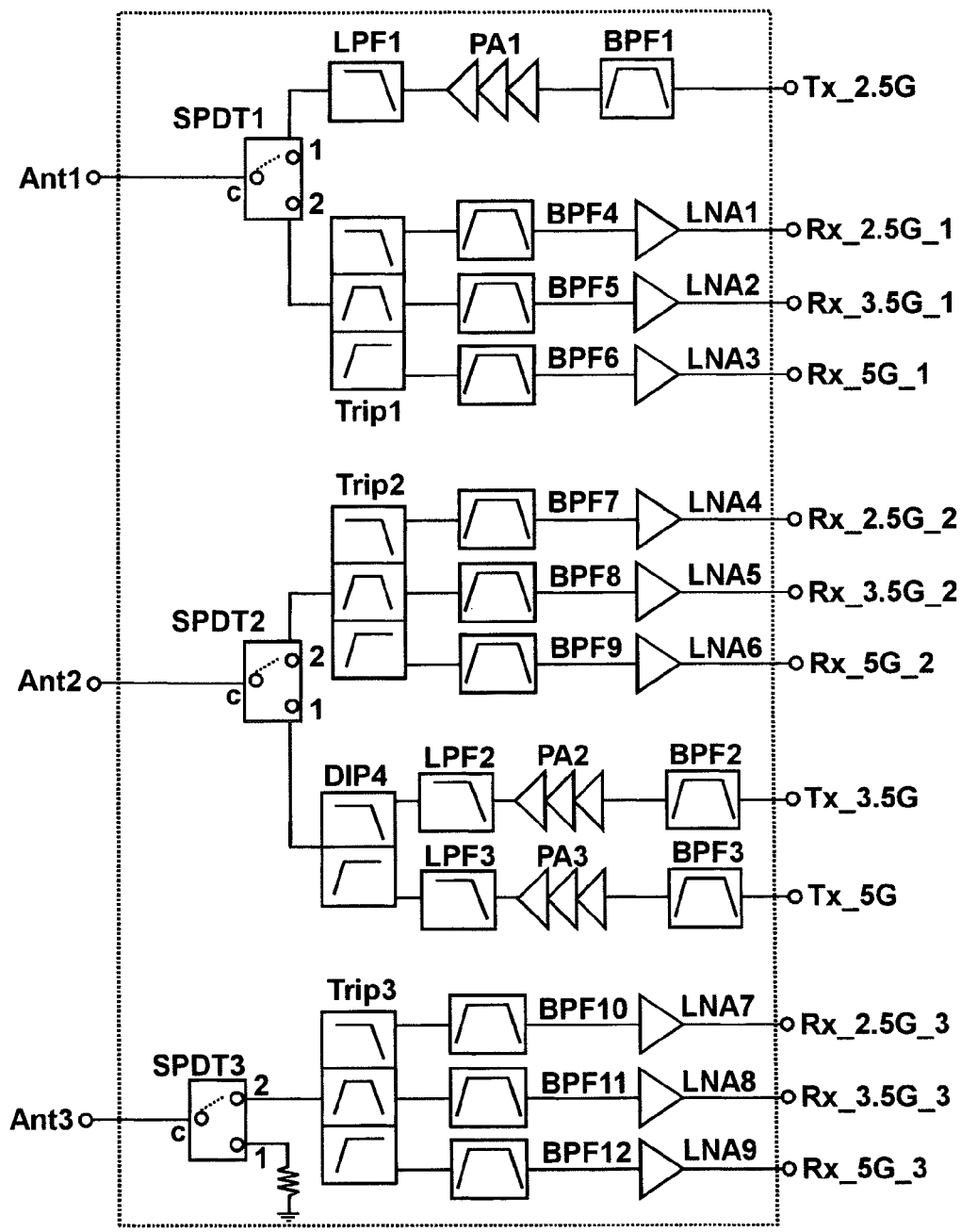
FIG. 13 is a block diagram showing a high-frequency circuit according to a still further embodiment of the present invention.

When the signal transmission loss of one communications system among the first to third communications systems need only be suppressed, the structure shown in FIG. 13, for example, can be used. This structure is obtained by changing the connection of transmitting terminals in the circuit shown in FIG. 11. Both the transmitting terminal Tx_3.5G for the second communications system and the transmitting terminal Tx_5G for the third communications system are connected to the first switching terminal 1 of the second switch circuit SPDT2 via a multiplexer circuit DIP4. The first switching terminal 1 of the third switch circuit SPDT3 is grounded via a terminal resistance. With this structure, the signal transmission loss of the first communications system can be suppressed. Accordingly, the structure shown in FIG. 13 is suitable when the suppression of signal transmission loss is more important in the first communications system than in other communications systems. Because this embodiment is the same as the already explained embodiments except for the connection of transmitting terminals, explanation will be omitted.

(10) Tenth Embodiment

Figure 14:
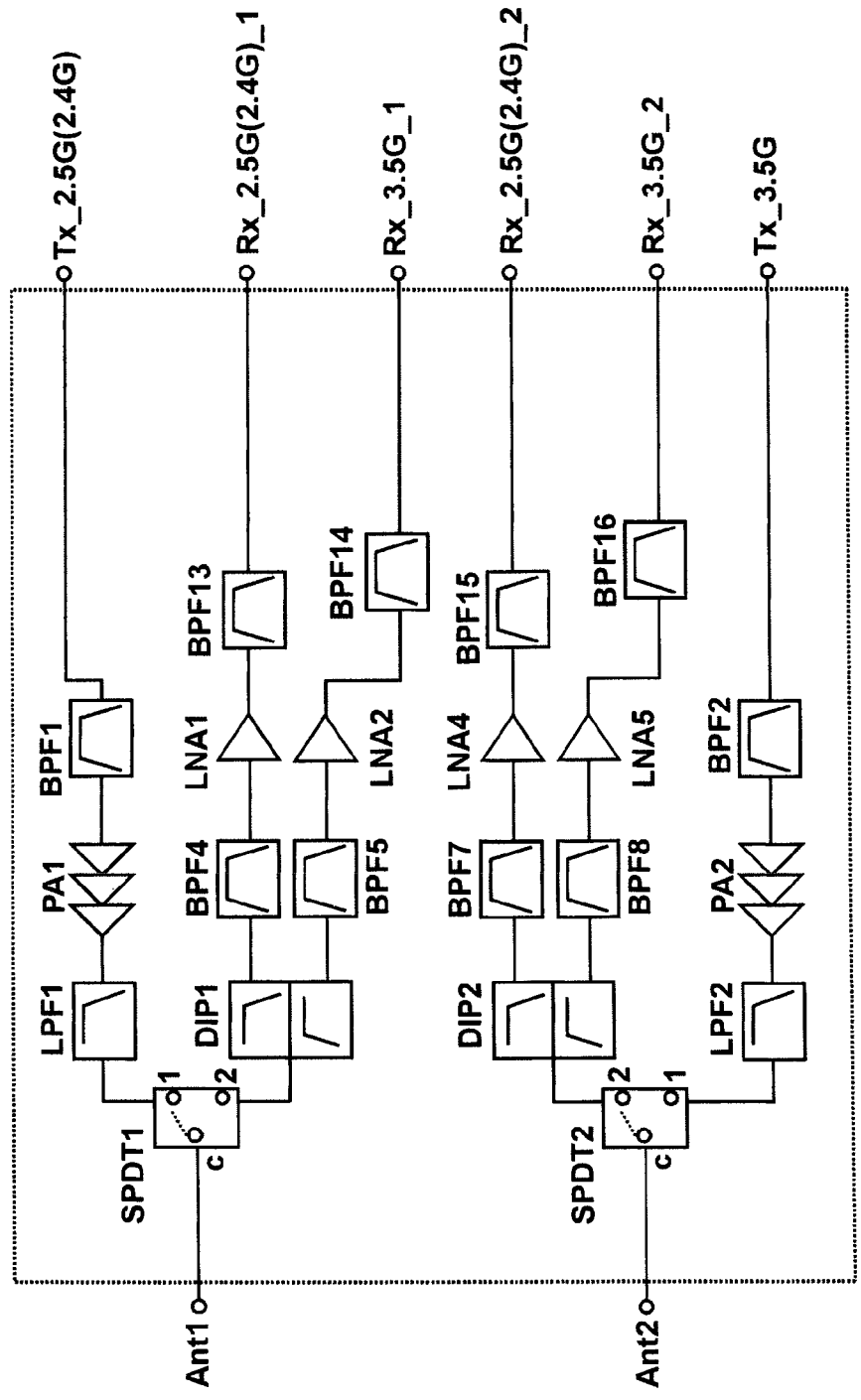
FIG. 14 is a block diagram showing a high-frequency circuit according to a still further embodiment of the present invention.

FIG. 14 shows one example of high-frequency circuits comprising bandpass filter circuits for removing unnecessary signals outside the desired communications bands, which are added between the low-noise amplifier circuits and the receiving terminals in the high-frequency circuit shown in FIG. 1. Although the first communications system is WiMAX in a 2.5-GHz band in the embodiment shown in FIG. 1, the use of a bandpass filter circuit operable in a wide band including, for example, a 2.4-GHz band and a 2.5-GHz band makes the path of the first communications system usable both for a 2.4-GHz band and a 2.5-GHz band. Incidentally, a bandwidth of the 2.4-GHz band is 2.3 GHz to 2.4 GHz, and a bandwidth of the 2.5-GHz band is 2.5 GHz to 2.7 GHz. In FIG. 14, as terminals usable in both 2.4-GHz band and 2.5-GHz band, a transmitting terminal for the first communications system is expressed as Tx_2.5G (2.4G), a first receiving terminal for the first communications system is expressed as Rx_2.5G (2.4G)_1, and a second receiving terminal for the first communications system is expressed as Rx_2.5G (2.4G)_2.

(11) Eleventh Embodiment

Figure 15:
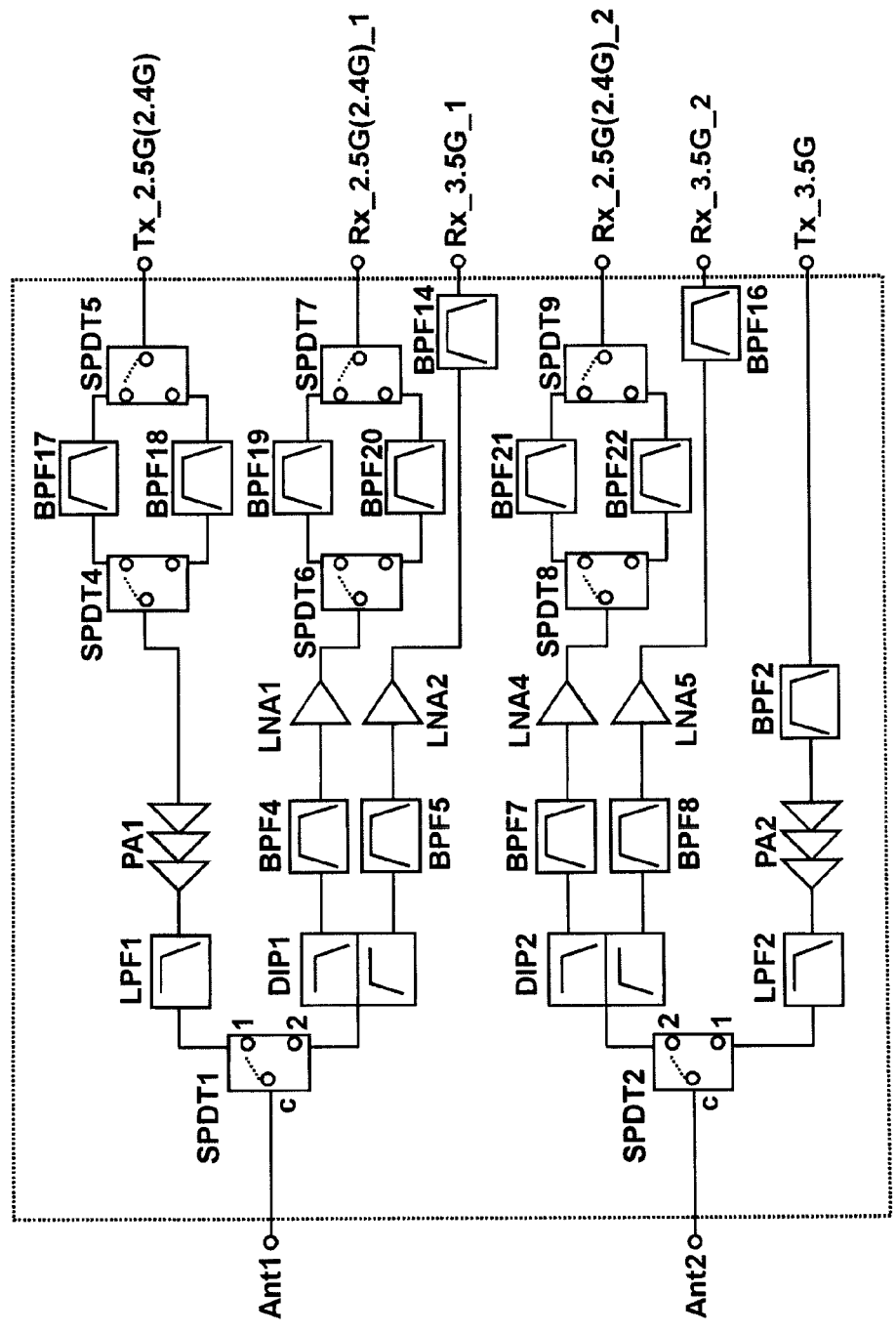
FIG. 15 is a block diagram showing a high-frequency circuit according to a still further embodiment of the present invention.

FIG. 15 shows another example of high-frequency circuits usable in two close communications frequency bands. The high-frequency circuit shown in FIG. 15 differs from that shown in FIG. 14, in structures between the high-frequency amplifier circuit and the transmitting terminal, and between the low-noise amplifier circuits and the receiving terminals, in the first communications system path. The high-frequency circuit shown in FIG. 15 comprises (a) a first branching circuit SPDT4 having a common terminal connected to a high-frequency amplifier circuit PA1, and a second branching circuit SPDT5 having a common terminal connected to a transmitting terminal Tx_2.5G (2.4G), in a path connected to the transmitting terminal for the first communications system, (b) a third branching circuit SPDT6 having a common terminal connected to a first low-noise amplifier circuit LNA1, and a fourth branching circuit SPDT7 having a common terminal connected to a first receiving terminal Rx_2.5G (2.4G)_1, in a path connected to the first receiving terminal for the first communications system, and (c) a fifth branching circuit SPDT8 having a common terminal connected to a second low-noise amplifier circuit LNA4, and a sixth branching circuit SPDT9 having a common terminal connected to a second receiving terminal Rx_2.5G (2.4G)_2, in a path connected to the second receiving terminal for the first communications system.

Bandpass filter circuits BPF17, BPF18 are connected between the first branching terminal of the first branching circuit SPDT4 and the first branching terminal of the second branching circuit SPDT5, and between the second branching terminal of the first branching circuit SPDT4 and the second branching terminal of the second branching circuit SPDT5, respectively. Likewise, bandpass filter circuits BPF 19, BPF20 are connected between the first branching terminal of the third branching circuit SPDT6 and the first branching terminal of the fourth branching circuit SPDT7, and between the second branching terminal of the third branching circuit SPDT6 and the second branching terminal of the fourth branching circuit SPDT7, respectively. Also, bandpass filter circuits BPF21, BPF22 are connected between the first branching terminal of the fifth branching circuit SPDT8 and the first branching terminal of the sixth branching circuit SPDT9, and between the second branching terminal of the fifth branching circuit SPDT8 and the second branching terminal of the sixth branching circuit SPDT9, respectively. Each bandpass filter circuit BPF17, BPF19, BPF21 disposed in one of the branched paths passes signals in one (2.4 GHz) of the close communications frequency bands, and attenuates signals outside the band. Each bandpass filter circuit BPF18, BPF20, BPF22 disposed in the other path of the branched paths passes signals in the other band (2.5 GHz) of the close communications frequency bands, and attenuates signals outside the band. In the case of a bandpass filter passing signals in 2.3-2.7 GHz, it is difficult to attenuate signals in a frequency band of 2.11-2.17 GHz used in cell phones, but the use of a bandpass filter for a 2.3-GHz to 2.4-GHz band and a bandpass filter for a 2.5-GHz to 2.7-GHz band makes it easy to have desired attenuation characteristics with small loss in a 2.11-GHz to 2.17-GHz band. The transmitting terminal Tx_2.5G (2.4G) and the first and second receiving terminals Rx_2.5G (2.4G)_1, Rx_2.5G (2.4G)_2 are used in both communications bands of 2.4 GHz and 2.5 GHz. With this structure, paths and terminals for the first communications system can be used in two frequency bands as close as within 100 MHz (for example, 2.4 GHz and 2.5 GHz).

In the embodiment shown in FIG. 15, SPDT-type switch circuits are used as branching circuits, and switch circuits upstream and downstream of the bandpass filters are synchronized to switch the paths, but the branching circuits are not restricted to switch circuits. For example, (a) one of the branched paths is provided with a bandpass filter circuit passing signals in a frequency band (2.4 GHz), one of close communications frequency bands, and attenuating signals in the other frequency band (2.5 GHz), and a phase line is provided upstream or downstream of the bandpass filter circuit, the length of the phase line being set such that a circuit constituted by the bandpass filter circuit and the phase line has input-side impedance, which is substantially open in the other frequency band, (b) the other branched path is provided with a bandpass filter circuit attenuating signals in a frequency band (2.4 GHz), one of close communications frequency bands, and passing signals in the other frequency band (2.5 GHz), and a phase line is provided upstream or downstream of the bandpass filter circuit, the length of the phase line being set such that a circuit constituted by the bandpass filter circuit and the phase line has input-side impedance, which is substantially open in one frequency band. In this case, in place of the branching circuits upstream or downstream of the bandpass filter circuit, a circuit constituted by a simple line branch or a combination of a simple line branch and a phase line is used.

(12) Twelfth Embodiment

Figure 16:
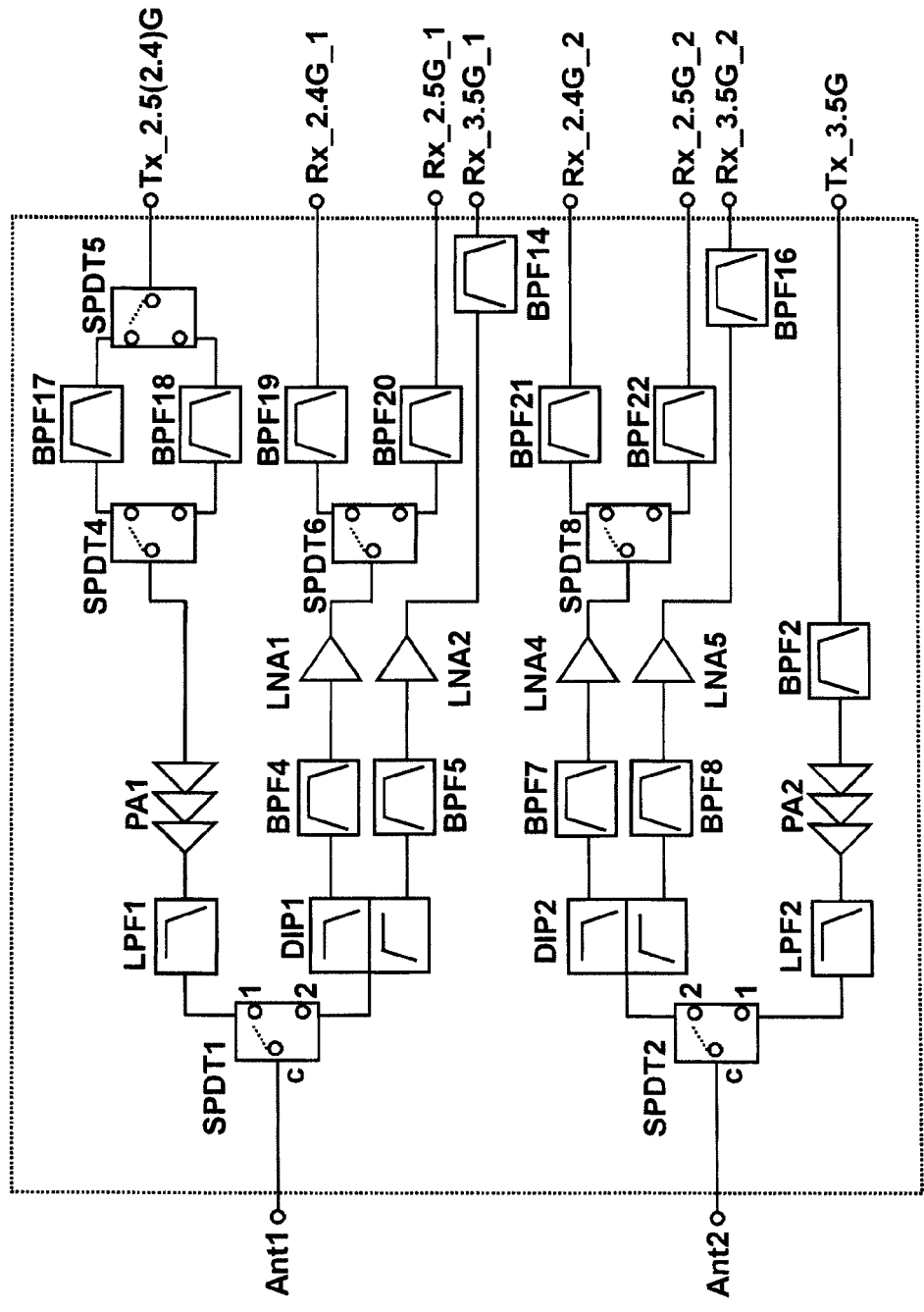
FIG. 16 is a block diagram showing a high-frequency circuit according to a still further embodiment of the present invention.

As another example usable in both a 2.4-GHz band and a 2.5-GHz band, a high-frequency circuit shown in FIG. 16 can be used. This high-frequency circuit is obtained by omitting the fourth and sixth branching circuits SPDT7, SPDT9, and changing each of the first and second receiving terminals Rx_2.5G (2.4G)_1, Rx_2.5G (2.4G)_ to two receiving terminals Rx_2.4G_1, Rx_2.5G_1, and Rx_2.4G_2, Rx_2.5G_2, respectively, in the high-frequency circuit shown in FIG. 15.

(13) Thirteenth Embodiment

Figure 17:
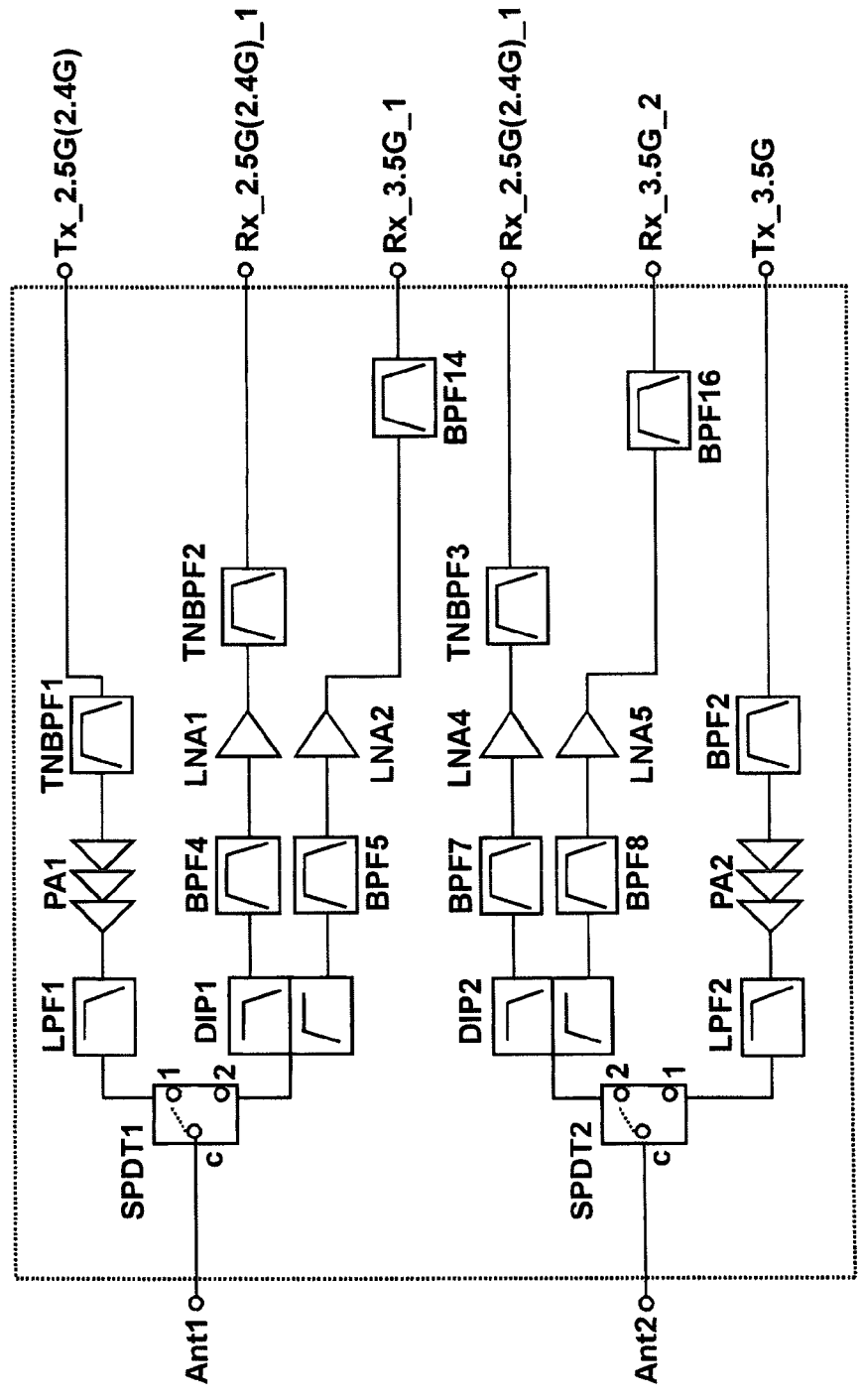
FIG. 17 is a block diagram showing a high-frequency circuit according to a still further embodiment of the present invention.

Using tunable bandpass filter circuits TNBPF1, TNBPF2, TNBPF3 shown in FIG. 17 in place of the partially branched paths shown in FIG. 15, and switching their passbands in close bands of 2.4 GHz and 2.5 GHz, the paths and terminals of the first communications system can be used in two close communications frequency bands, like in the embodiment shown in FIG. 15. The tunable bandpass filter circuit has a structure, for example, shown in FIGS. 18(a) and 18(b).

Figure 18A:
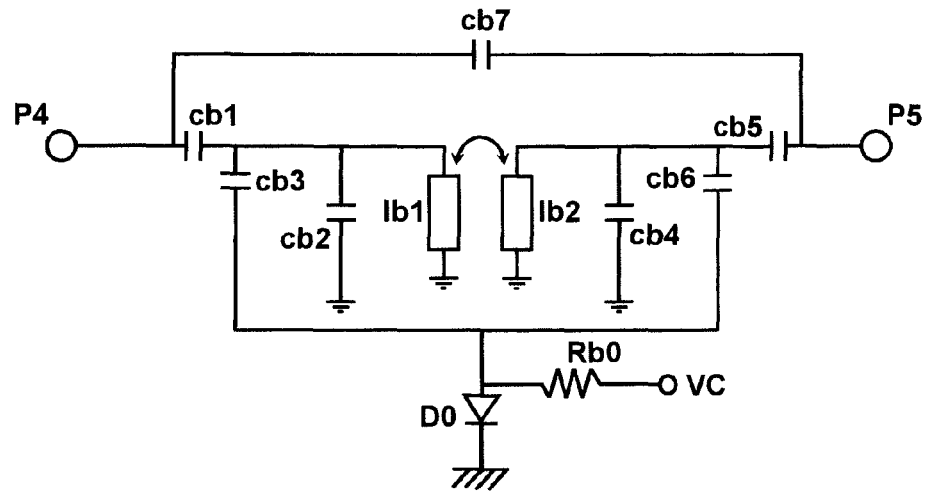
FIG. 18(a) is a view showing one example of the equivalent circuits of a tunable bandpass filter used in the high-frequency circuit of the present invention.

The tunable bandpass filter shown in FIG. 18(a) comprises pluralities of resonators each comprising an inductance element and a capacitance element between the input/output ports P4, P5, and capacitance elements cb3, cb6 constituting the bandpass filter are grounded via a diode D0. A power supply terminal VC for controlling the ON/OFF of the diode D0 is connected via a resistance element Rb0 between a ground-side connection point of the capacitance elements cb3, cb6 and the diode D0. When the voltage of the power supply terminal VC is 0 V, and when the diode D0 is in an OFF state, the passband frequency of the bandpass filter is determined by a parallel resonance frequency of an inductance element lb1 and a capacitance element cb2 and a parallel resonance frequency of an inductance element lb2 and a capacitance element cb4, because the diode D0 has small capacitance in an OFF state. When voltage of 3 V is applied from the power supply terminal VC to turn the diode D0 to an ON state, substantially a short-circuited state, the passband frequency of the bandpass filter is determined by a parallel resonance frequency of the inductance element lb1 and capacitance elements cb2, cb3 and a parallel resonance frequency of the inductance element lb2 and capacitance elements cb4, cb6. Accordingly, the ON/OFF state of the diode D0 changes capacitance determining the passband frequency, and thus changes the passband frequency. The diode D0 has larger capacitance in an ON state, resulting in a low passband frequency.

Figure 18B:
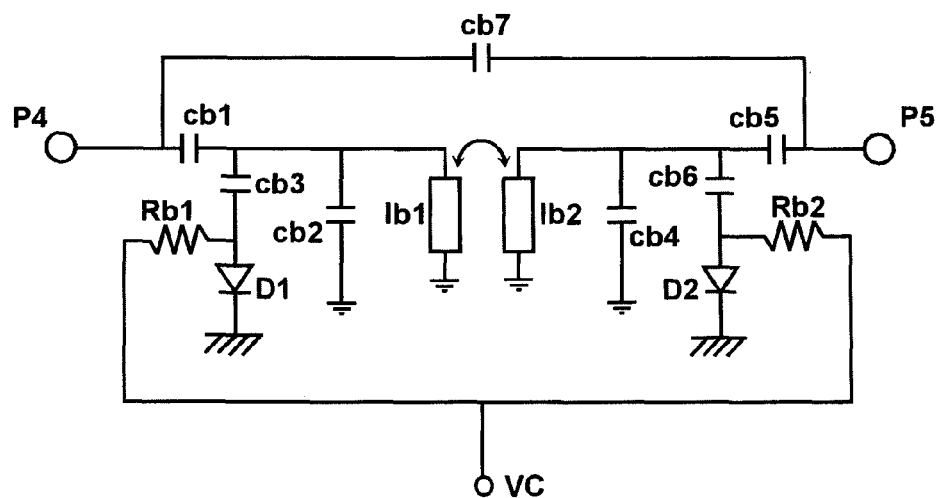
FIG. 18(b) is a view showing another example of the equivalent circuits of a tunable bandpass filter used in the high-frequency circuit of the present invention.

The tunable bandpass filter shown in FIG. 18(b) is a circuit comprising a diode D1 between a capacitance element cb3 and the ground, and a diode D2 between a capacitance element cb6 and the ground. A power supply terminal VC for controlling the ON/OFF of the diodes D1, D2 is connected via resistance elements Rb1, Rb2 between the capacitance element cb3 and the diode D1 and between the capacitance element cb6 and the diode D2. Larger isolation is obtained between the capacitance element cb3 and the capacitance element cb6 than in FIG. 18(a), because the resistance elements Rb1, Rb2 are connected between the capacitance elements cb3 and cb6. Because the other operations are the same as in the circuit shown in FIG. 18(a), their explanation will be omitted. The diodes may be changed to other switching means, for example, field-effect-transistor-type switches or MEMS-type switches. The tunable bandpass filter is not restricted to have the above structure, but may have other circuit structures.

When a passband should be widened in a 3.5-GHz band like in a 2.5-GHz band, the embodiments shown in FIGS. 14-17 are applicable to a transmission-side bandpass filter BPF2 and receiving-side bandpass filters BPF14, BPF16, for the second communications system. The structures shown in FIGS. 14-17 used in two close communications frequency bands can also be used in the other embodiments than those described above.

Depending on necessary functions and characteristics, proper circuit elements may be added to the high-frequency circuit of the present invention. For example, (a) by providing the high-frequency circuit shown in FIG. 14 with electrostatic-protection highpass filters HPF1, HPF2 between the first antenna terminal Ant1 and the first switch circuit SPDT1, and between the second antenna terminal Ant2 and the second switch circuit SPDT2, and (b) by connecting balanced-unbalanced conversion circuits BAL1 to BAL6 to the transmitting terminal Tx_2.5G and the first and second receiving terminals Rx_2.5G_1, Rx_2.5G_2 for the first communications system, and to the transmitting terminal Tx_3.5G and the first and second receiving terminals Rx_3.5G_1, Rx_3.5G_2 for the second communications system, respectively, with these terminals turned to balanced terminals, the first communications system being WiMAX in a 2.5-GHz band, and the second communications system being WiMAX in a 3.5-GHz band, a high-frequency circuit shown in FIG. 19 can be obtained. Also, the high-frequency circuit shown in FIG. 14 can be provided, for example, with an output-matching circuit and a lowpass filter circuit shown in FIG. 20 between each high-frequency amplifier circuit PA1, PA2 and each switch circuit SPDT1, SPDT2. In FIG. 20, loa1 to loa4 and loa6 indicate inductance elements, and coa1 and coa2 indicate capacitance elements.

Figure 19:
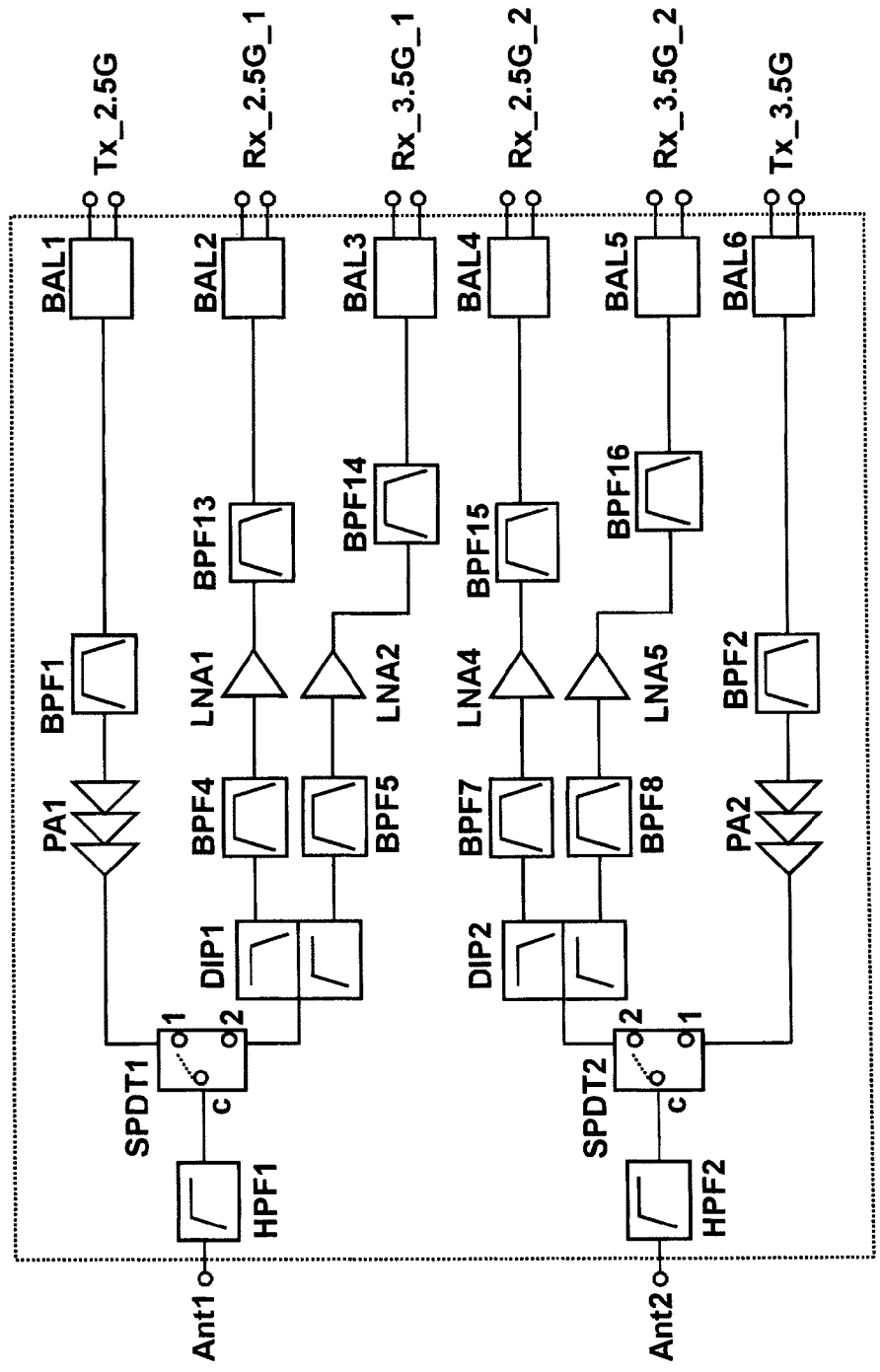
FIG. 19 is a block diagram showing a high-frequency circuit according to a still further embodiment of the present invention.
Figure 20:
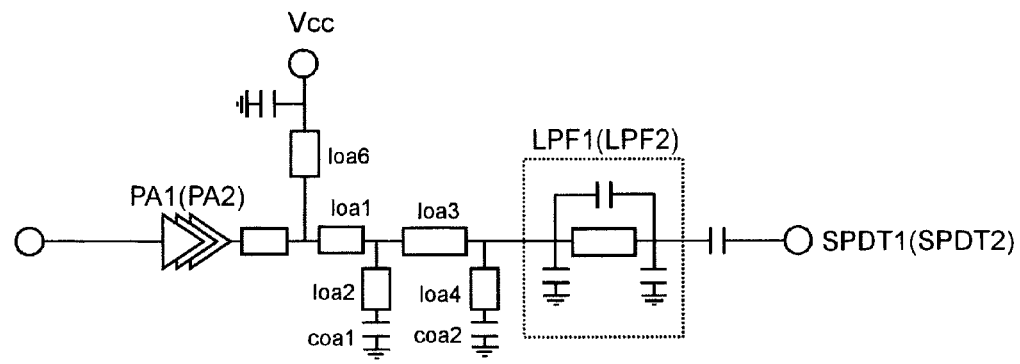
FIG. 20 is a view showing a circuit between a high-frequency amplifier circuit and a switch circuit.
Figure 21:
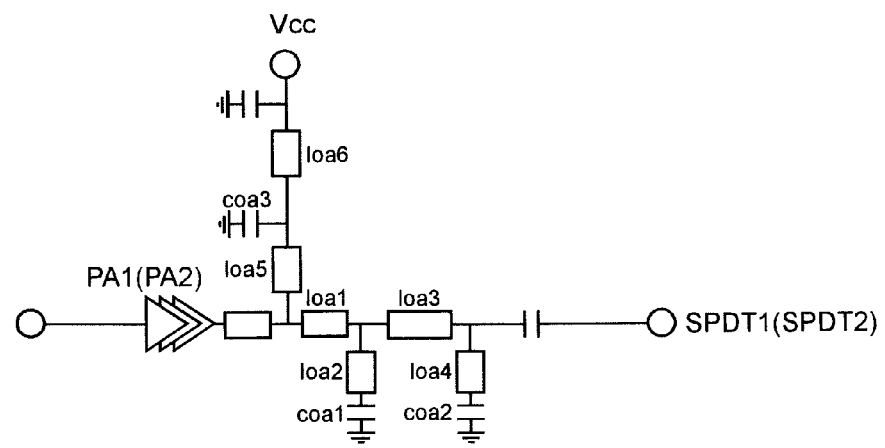
FIG. 21 is a view showing another circuit between a high-frequency amplifier circuit and a switch circuit.

The high-frequency circuit shown in FIG. 19 can be provided, for example, with an output-matching circuit shown in FIG. 21 between each high-frequency amplifier circuit PA1, PA2 and each switch circuit SPDT1, SPDT2. A resonance circuit comprising an inductance element loa5 and a shunt capacitance element coa3 is connected to a line connected to a power supply Vcc for the high-frequency amplifier circuit, to suppress harmonics. This structure makes a lowpass filter circuit unnecessary between the high-frequency amplifier and the switch circuit, reducing output loss. Though not depicted, a bypass circuit for avoiding saturation when excess signals are input may be added to the high-frequency amplifier circuits PA1, PA2 and the low-noise amplifier circuits LNA1, LNA2, LNA3, LNA4.

[2] High-Frequency Device

Figure 22:
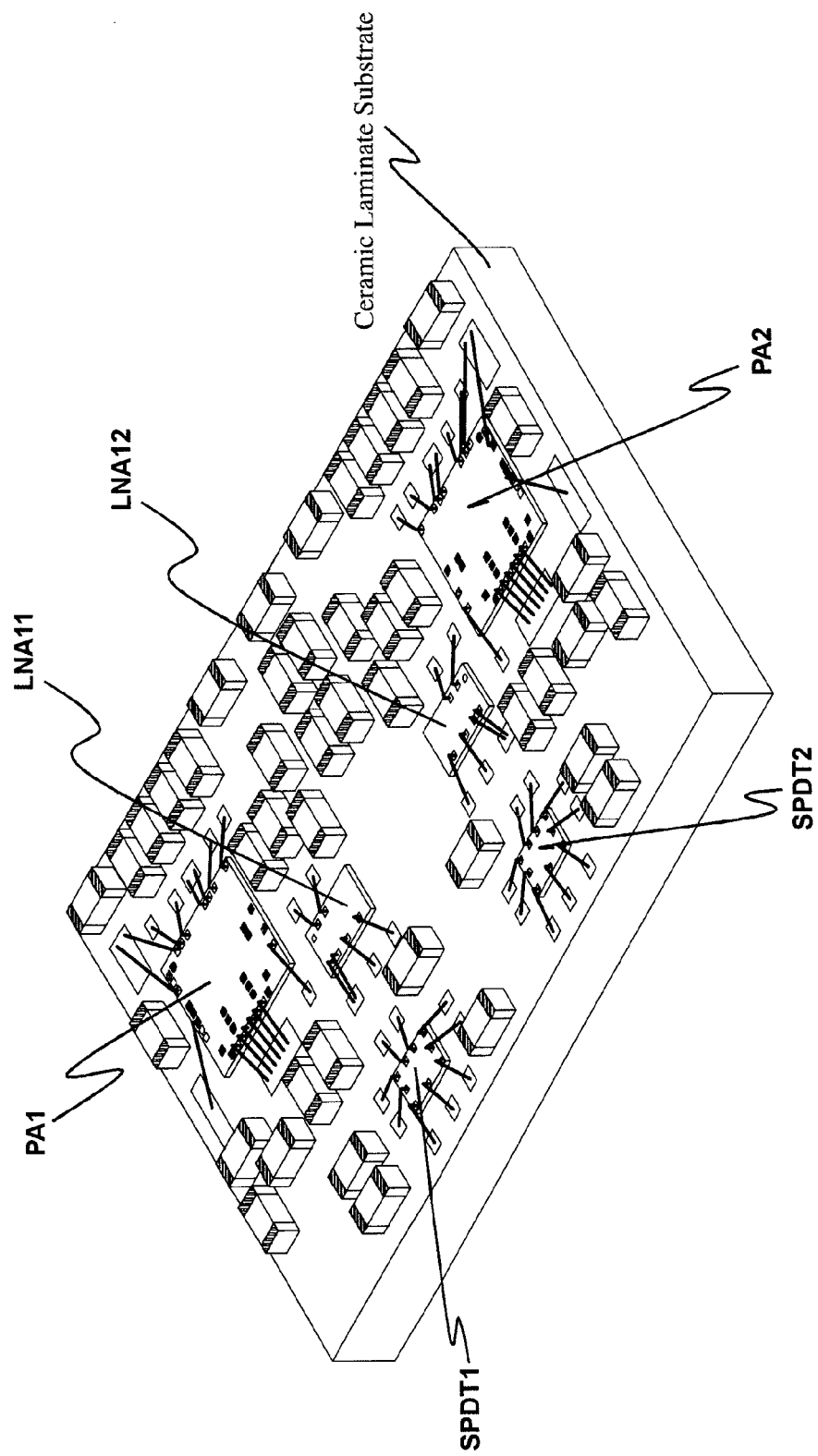
FIG. 22 is a perspective view showing a high-frequency device according to one embodiment of the present invention, which is constituted by a ceramic laminate substrate.
Figure 23:
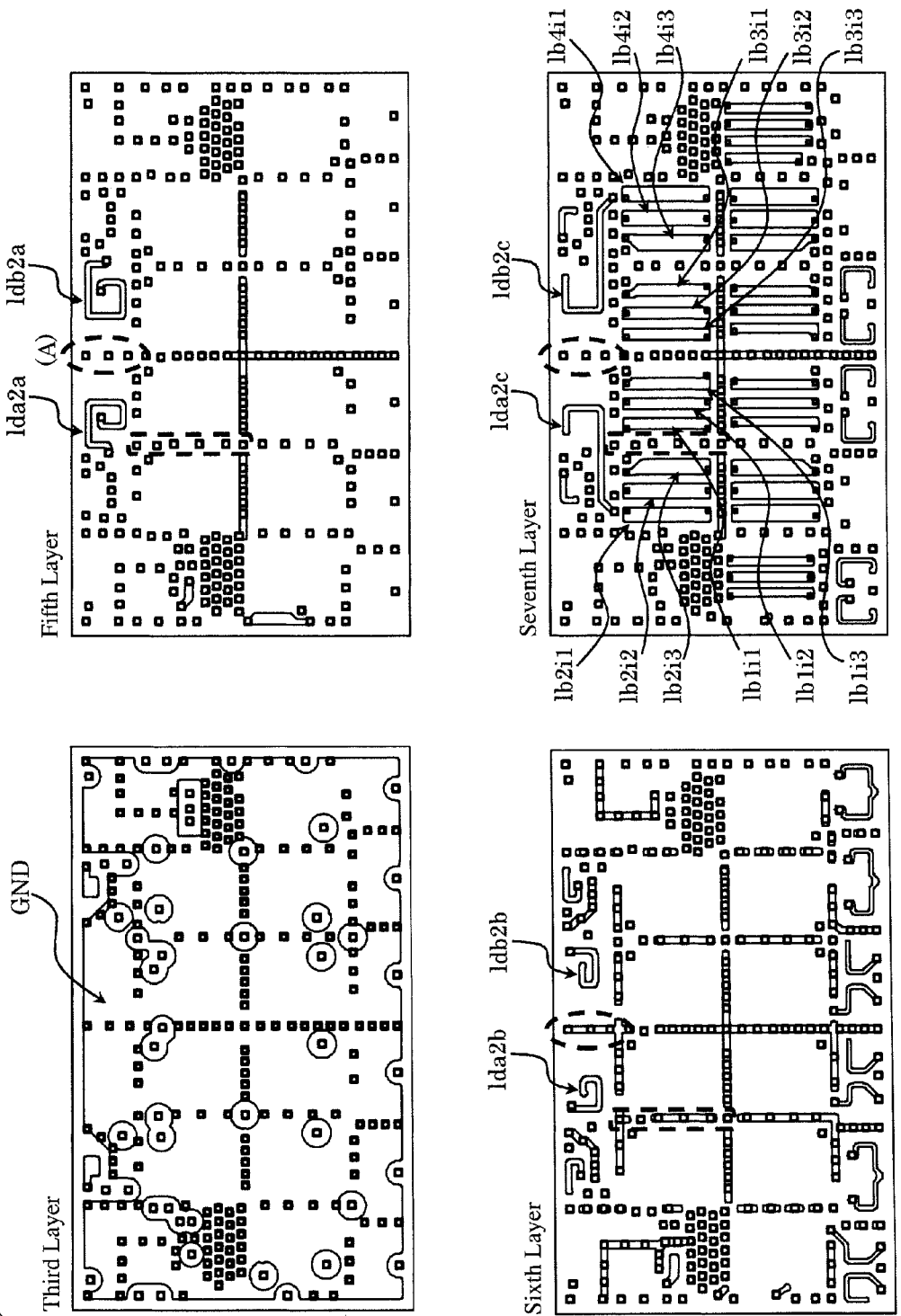
FIG. 23 is a developed view showing part of a laminate module, which is a high-frequency device according to one embodiment of the present invention.
Figure 24:
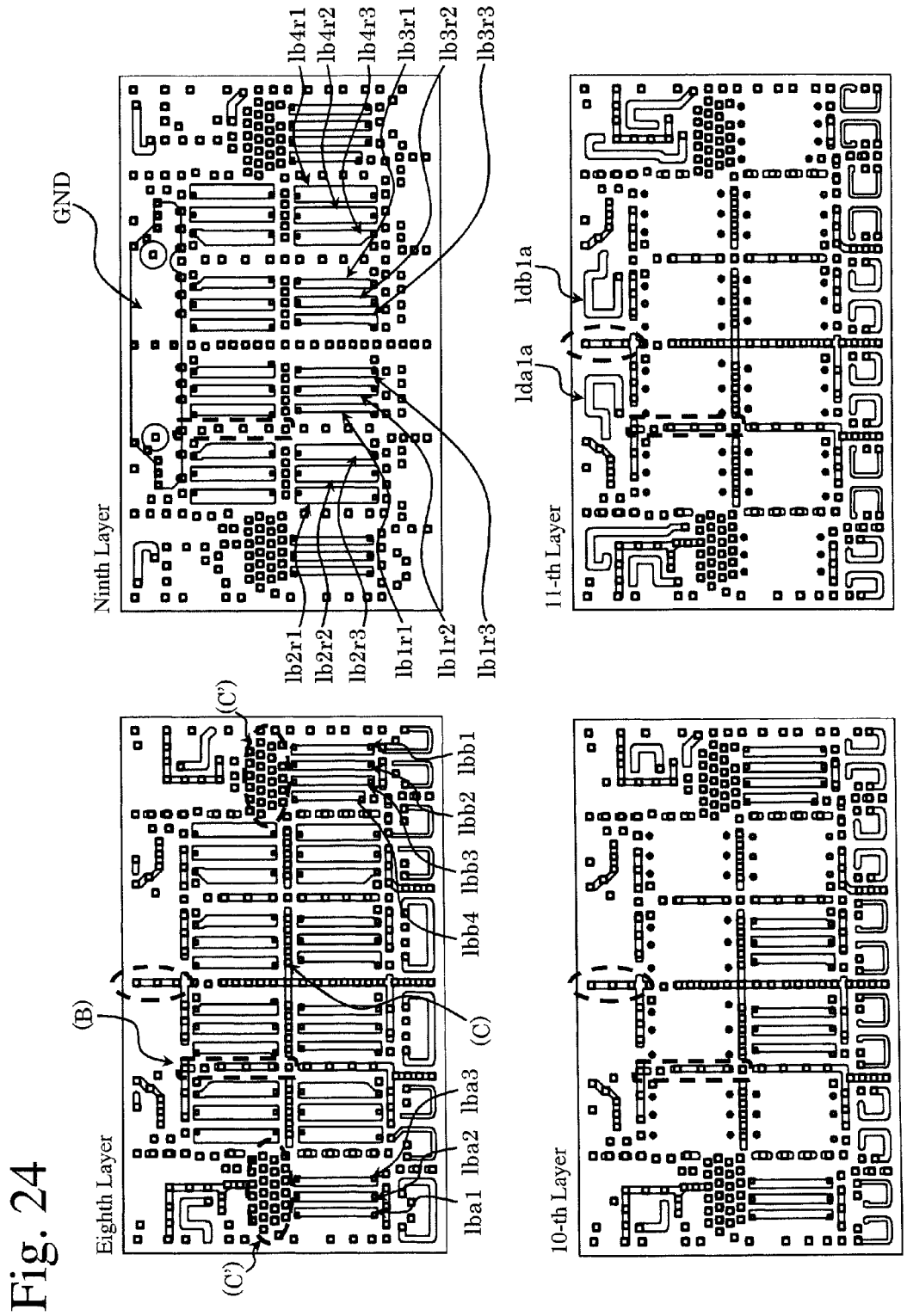
FIG. 24 is a developed view showing another part of a laminate module, which is a high-frequency device according to one embodiment of the present invention.
Figure 25:
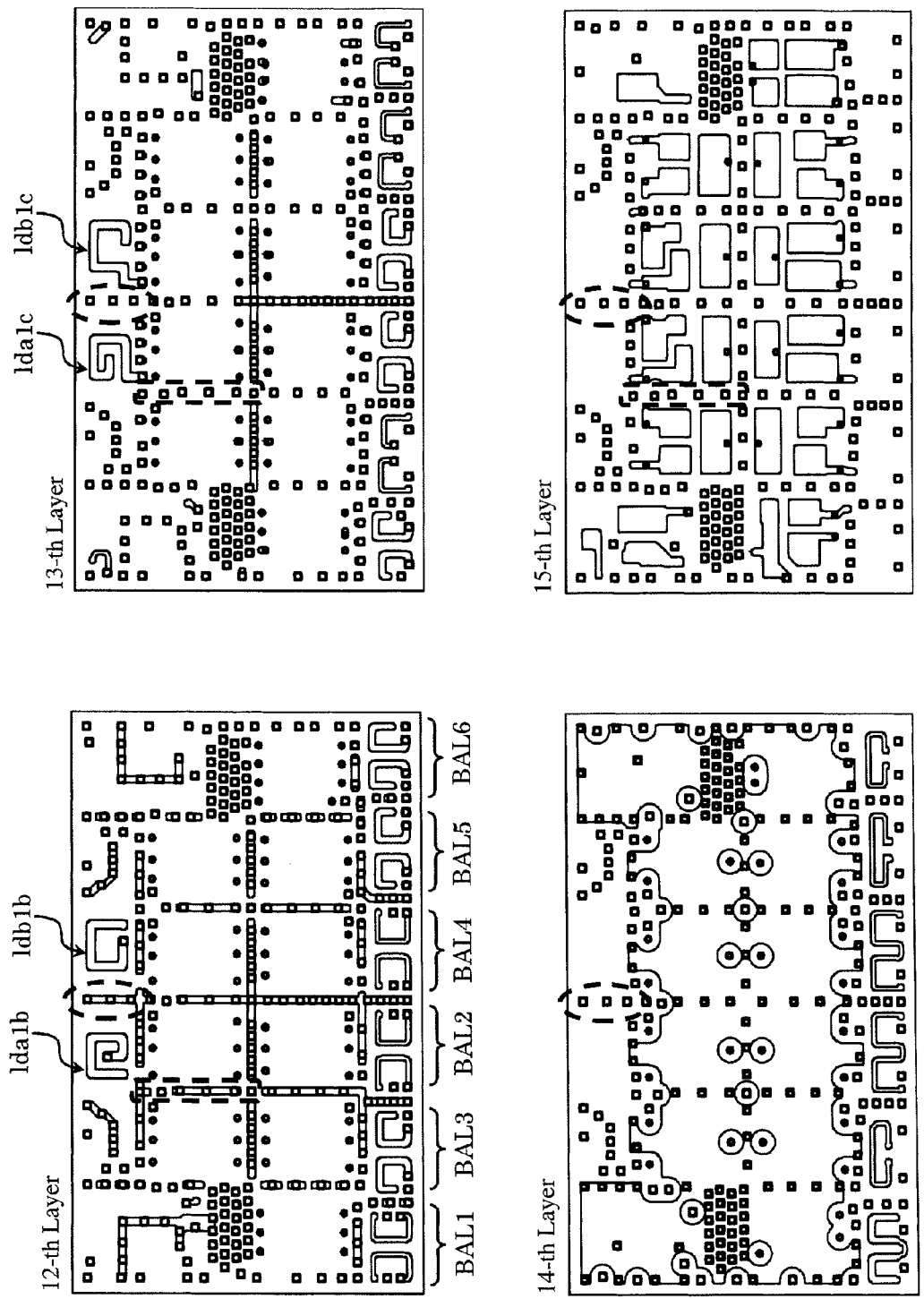
FIG. 25 is a developed view showing a further part of a laminate module, which is a high-frequency device according to one embodiment of the present invention.
Figure 26:
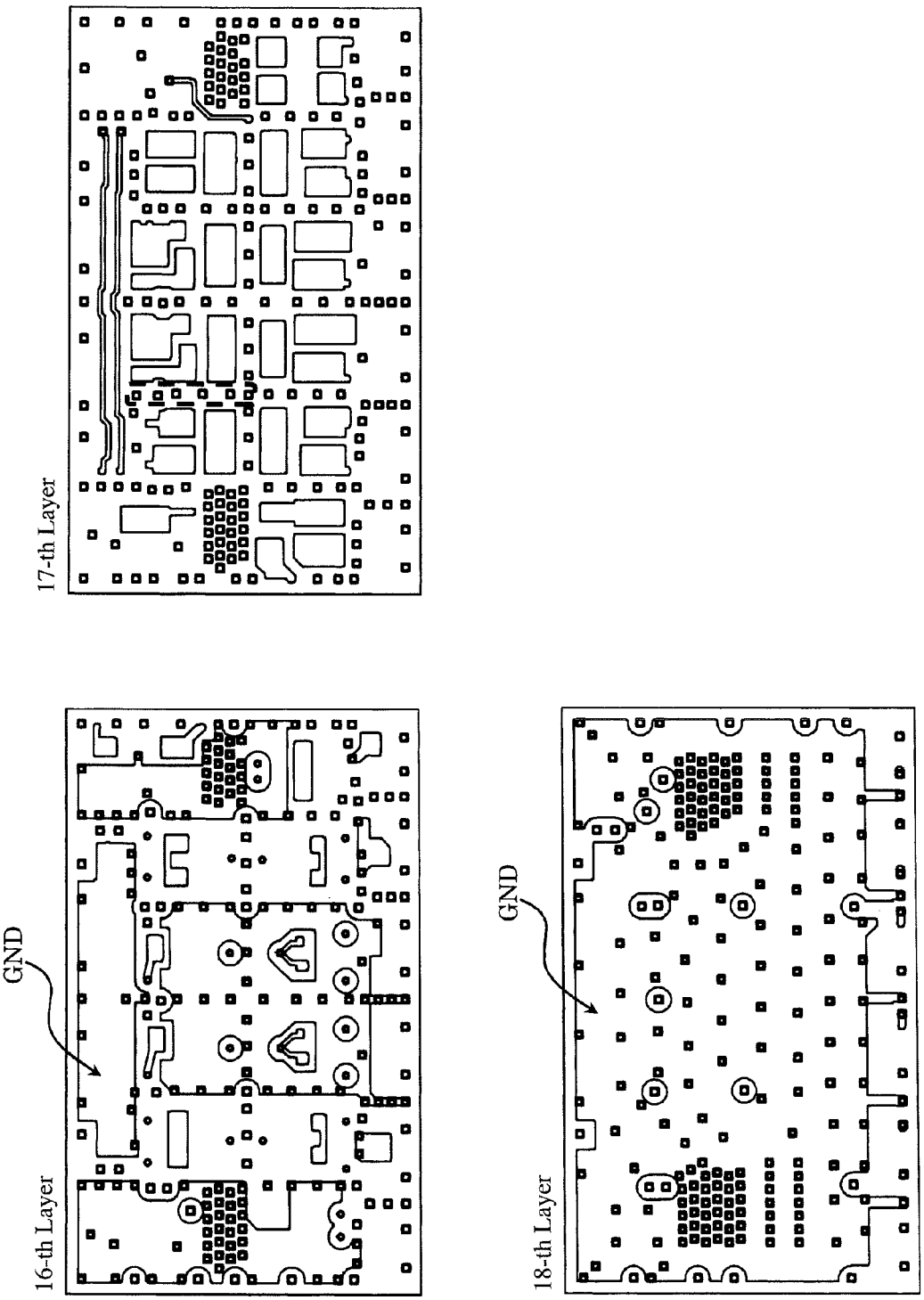
FIG. 26 is a developed view showing a still further part of a laminate module, which is a high-frequency device according to another embodiment of the present invention.

A high-frequency device having the high-frequency circuit of the present invention is preferably constituted by a laminate (ceramic laminate substrate). FIG. 22 shows one example of high-frequency devices having the high-frequency circuit shown in FIG. 2. A ceramic laminate substrate can be produced, for example, by printing each green sheet as thick as 10-200 μm made of dielectric ceramics LTCC (low-temperature-cofirable ceramics) sinterable at low temperatures of 1000° C. or lower with a low-resistivity conductor paste of Ag, Cu, etc. to form predetermined electrode patterns, and integrally laminating and sintering the resultant green sheets with electrode patterns. The preferred dielectric ceramic materials are, for example, (a) materials comprising Al, Si and Sr as main components, and Ti, Bi, Cu, Mn, Na and K as sub-components, (b) materials comprising Al, Si and Sr as main components, and Ca, Pb, Na and K as sub-components, (c) materials comprising Al, Mg, Si and Gd, and (d) materials comprising Al, Si, Zr and Mg, all having dielectric constants of about 5-15. Using an HTCC (high-temperature cofired ceramic) technology, ceramic laminate substrates may be produced by green sheets made of dielectric $Al_2O_3$-based ceramic materials, and transmission lines made of high-temperature-sinterable metals such as tungsten, molybdenum, etc. Further, in addition to the dielectric ceramic materials, resins or composites of resins and dielectric ceramic powder may be used.

Each layer in the ceramic laminate substrate is provided with proper electrode patterns for inductance elements, capacitance elements, wiring lines, and ground electrodes, and via-hole electrodes are formed between the layers to constitute desired circuits. Mainly constituted are LC circuit portions. Here, the bandpass filter circuits, the lowpass filter circuits and the highpass filter circuits are formed mainly in the ceramic multi-layer substrate. Part of each circuit may be chip devices mounted on an upper surface of the ceramic multi-layer substrate.

Devices such as semiconductor devices for the switch circuits, the high-frequency amplifier circuits and the low-noise amplifier circuits, chip capacitors, chip resistors, chip inductors, etc. are mounted on the ceramic laminate substrate. The switch circuits include those using field effect transistors such as GaAs FET, and those using diodes. The use of field effect transistors for the switch circuits miniaturizes the high-frequency device (high-frequency module). The mounted devices are connected to the ceramic laminate substrate by a wire bonder, LGA, BGA, etc. Of course, the devices mounted on the ceramic laminate substrate and the elements contained in the ceramic laminate substrate are connected to constitute the desired high-frequency circuit. A bottom surface of the ceramic laminate substrate is provided with transmitting terminals, receiving terminals and antenna terminals for the high-frequency circuit, power supply terminals for the amplifier circuits, etc. In FIG. 22, IC chips for the high-frequency amplifier circuits, the low-noise amplifier circuits and the switch circuits are wire-bonded to the upper surface of the high-frequency device. The use of low-noise amplifier circuits commonly in the first and second communications systems reduces the number and mounting area of low-noise amplifier circuits used, thereby miniaturizing the high-frequency device as shown in FIG. 22.

FIGS. 23-26 show the arrangement of conductor patterns on each substrate constituting a high-frequency device (laminate module) having the high-frequency circuit shown in FIG. 19. In this embodiment, bandpass filter circuits BPF1, BPF13, BPF15, BPF2, BPF14, BPF16 are connected between the transmitting terminal Tx_2.5G for the first communications system and the high-frequency amplifier circuit PA1, between the first receiving terminal Rx_2.5G_1 for the first communications system and the low-noise amplifier circuit LNA1, between the second receiving terminal Rx_2.5G_2, for the first communications system and the low-noise amplifier circuit LNA4, between the transmitting terminal Tx_3.5G for the second communications system and the high-frequency amplifier circuit PA2, between the first receiving terminal Rx_3.5G_1 for the second communications system and the low-noise amplifier circuit LNA2, and between the second receiving terminal Rx_3.5G_2 for the second communications system and the low-noise amplifier circuit LNA5, respectively. Further, bandpass filter circuits BPF4, BPF5, BPF7, BPF8 are connected between the lowpass filter part of the first receiving-side multiplexer circuit DIP1 and the low-noise amplifier circuit LNA1, between the highpass filter part of the first receiving-side multiplexer circuit DIP 1 and the low-noise amplifier circuit LNA2, between the lowpass filter part of the second receiving-side multiplexer circuit DIP2 and the low-noise amplifier circuit LNA4, and between the highpass filter part of the second receiving-side multiplexer circuit DIP2 and the low-noise amplifier circuit LNA5, respectively. Accordingly, 10 bandpass filter circuits, exceeding the total number of transmitting terminals and receiving terminals, are formed in the laminate module.

Figure 27:
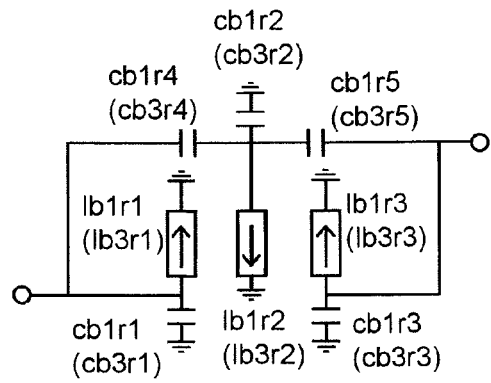
FIG. 27 is a view showing one example of the equivalent circuits of a bandpass filter used in the high-frequency device of the present invention.

The bandpass filter circuits BPF13 and BPF15 provided in the receiving path for the first communications system have the same equivalent circuit (shown in FIG. 27). Each bandpass filter circuit BPF13, BPF15 comprises a three-stage resonator comprising three resonator lines $lb1r1$ to $lb1r3$, $lb3r1$ to $lb3r3$ each having one end grounded and the other end connected to a grounded capacitance $ch1r1$ to $cb1r3$, $cb3r1$ to $cb3r3$. The orientation (grounding direction) of the center resonator line $lb1r2$, $lb3r2$ is opposite to that of the resonator lines $lb1r1$, $lb1r3$, $lb3r1$, $lb3r3$ on both sides. Connected between the center resonator line $lb1r2$, $lb3r2$ and the grounded-capacitance side of each resonator line $lb1r1$, $lb3r1$, $lb1r3$, $lb3r3$ on both sides is coupling capacitance (interstage capacitance) $cb1r4$, $cb3r4$, $cb1r5$, $cb3r5$.

Figure 28:
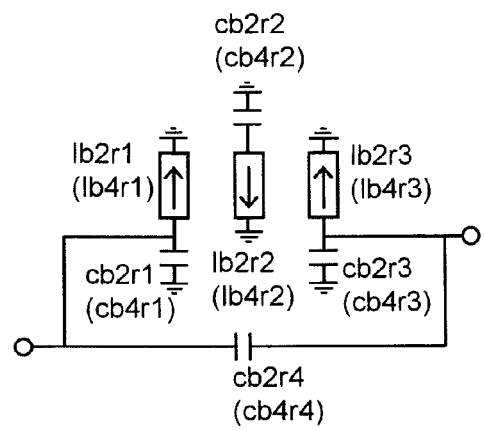
FIG. 28 is a view showing another example of the equivalent circuits of a bandpass filter used in the high-frequency device of the present invention.

Bandpass filter circuits BPF14 and BPF16 provided in the receiving path for the second communications system have the same equivalent circuit (shown in FIG. 28). Each bandpass filter circuit BPF14, BPF16 comprises a three-stage resonator comprising three resonator lines $lb2r1$ to $lb2r3$, $lb4r1$ to $lb4r3$ each having one end grounded and the other end connected to a grounded capacitance $cb2r1$ to $cb2r3$, $cb4r1$ to $cb4r3$. With respect to the connecting position to the ground or the grounded capacitance, the orientation of the center resonator line $lb2r2$, $lb4r2$ is opposite to that of the resonator lines $lb2r1$, $lb2r3$, $lb4r1$, $lb4r3$ on both sides. Connected between the grounded-capacitance sides of the resonator lines $lb2r1$, $lb2r3$ and $lb4r1$, $lb4r3$ on both sides is a coupling capacitance (jump capacitance) $cb2r4$, $cb4r4$.

Figure 29:
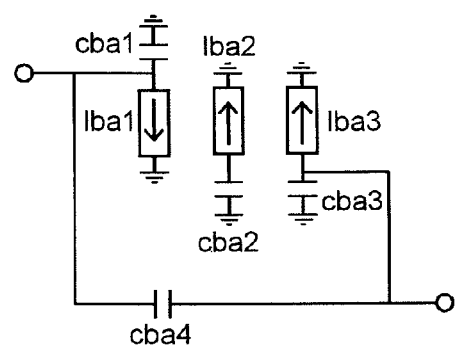
FIG. 29 is a view showing a further example of the equivalent circuits of a bandpass filter used in the high-frequency device of the present invention.
Figure 30:
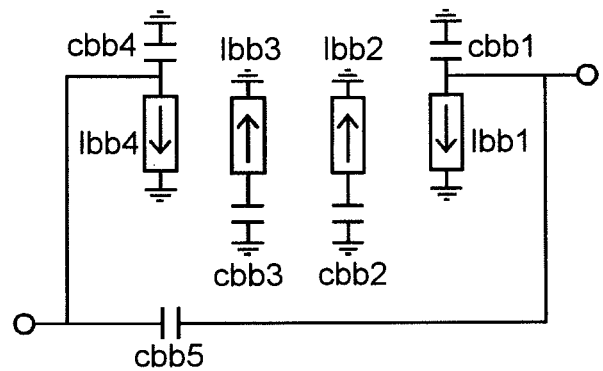
FIG. 30 is a view showing a still further example of the equivalent circuits of a bandpass filter used in the high-frequency device of the present invention.

A bandpass filter circuit BPF1 provided in the transmitting path for the first communications system, and a bandpass filter circuit BPF2 provided in the transmitting path for the second communications system have the equivalent circuits shown in FIGS. 29 and 30, respectively. As shown in FIG. 29, the bandpass filter circuit BPF1 comprises a three-stage resonator comprising three resonator lines $lba1$ to $lba3$ each having one end grounded and the other end connected to a grounded capacitance $cba1$ to $cba3$. One of the resonator lines $lba1$, $lba3$ on both sides has the same orientation (grounding direction) as that of the center resonator line $lba2$, and the other one has an opposite orientation. A coupling capacitance (jump capacitance) $cba4$ is connected between the grounded-capacitance sides of the resonator lines $lba1$ and $lba3$ on both sides. As shown in FIG. 30, the bandpass filter circuit BPF2 comprises a four-stage resonator comprising four resonator lines $lbb1$ to $lbb4$ each having one end grounded and the other end connected to a grounded capacitance $cbb1$ to $cbb4$. Two center resonator lines $lbb2$, $lbb3$ have the same orientation (grounding direction), while their orientations are opposite to those of the resonator lines $lbb1$, $lbb4$ on both sides. A coupling capacitance (jump capacitance) $cbb5$ is connected between the grounded-capacitance sides of the resonator lines $lbb1$ and $lbb4$ on both sides.

Figure 31:
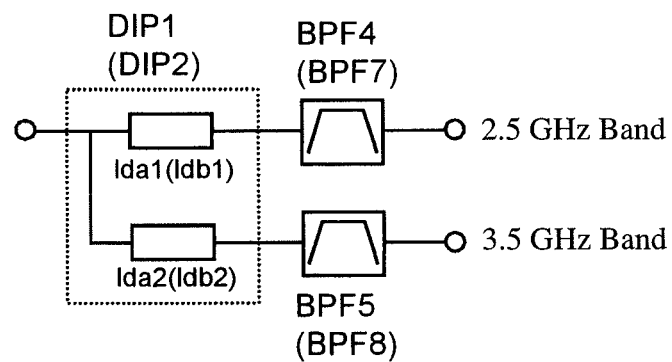
FIG. 31 is a view showing one example of the equivalent circuits of a multiplexer circuit used in the high-frequency device of the present invention.

In the embodiments shown in FIGS. 19 and 23-26, each of the first and second receiving-side multiplexer circuits DIP1 and DIP2 has an equivalent circuit shown in FIG. 31, in which bandpass filter circuits connected DIP1 and DIP2 are also shown. A lowpass filter part and a highpass filter part of the first receiving-side multiplexer circuit DIP1 are constituted by phase lines $lda1$, $lda2$, respectively. The phase line $lda1$ of the lowpass filter part is adjusted such that its impedance is high in the frequency band of the second communications system when this lowpass filter part is viewed from the common terminal of the multiplexer circuit on the first switch circuit side, and the phase line $lda2$ of the highpass filter part is adjusted such that its impedance is high in the frequency band of the first communications system when this highpass filter part is viewed from the common terminal of the multiplexer circuit on the first switch circuit side. The lowpass filter part and highpass filter part of the second receiving-side multiplexer circuit DIP2 are also constituted by phase lines $ldb1$, $ldb2$, respectively. A bandpass filter circuit BPF4 is connected between the lowpass filter part of the first receiving-side multiplexer circuit DIP1 and the low-noise amplifier circuit LNA1. The bandpass filter circuit BPF4 prevents unnecessary signals including signals for the second communications system from entering the low-noise amplifier circuit LNA1. A bandpass filter circuit BPF5 is connected between the highpass filter part of the first receiving-side multiplexer circuit DIP1 and the low-noise amplifier circuit LNA2. The bandpass filter circuit BPF5 prevents unnecessary signals including signals for the first communications system from entering the low-noise amplifier circuit LNA2. With phase lines of the lowpass filter part and the highpass filter part with bandpass filter circuits, a function as a multiplexer is obtained.

Figure 32:
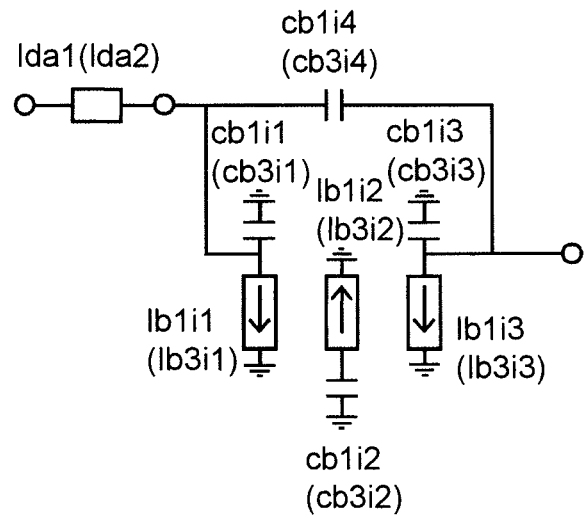
FIG. 32 is a view showing a still further example of the equivalent circuits of a bandpass filter used in the high-frequency device of the present invention.
Figure 33:
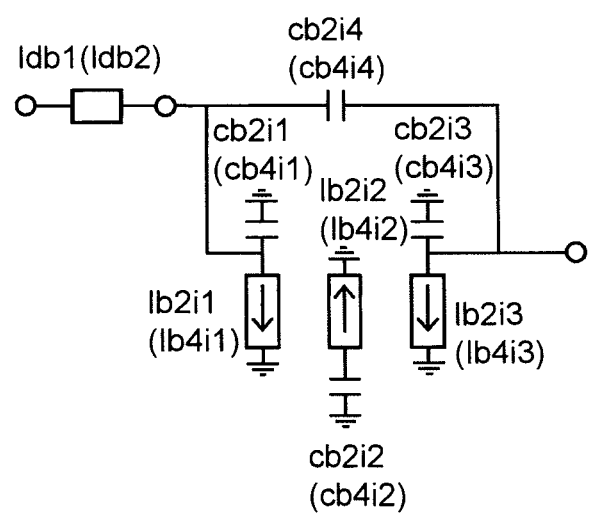
FIG. 33 is a view showing a still further example of the equivalent circuits of a bandpass filter used in the high-frequency device of the present invention.

A bandpass filter circuit BPF7 is connected between the lowpass filter part of the second receiving-side multiplexer circuit DIP2 and the low-noise amplifier circuit LNA4, and a bandpass filter circuit BPF8 is connected between the highpass filter part of the second receiving-side multiplexer circuit DIP2 and the low-noise amplifier circuit LNA5. Because their arrangements and functions are the same as those between the first receiving-side multiplexer circuit DIP1 and the low-noise amplifier circuit LNA1 and the low-noise amplifier circuit LNA2, their explanation will be omitted. The bandpass filter circuits BPF4, BPF7 have the same equivalent circuit (shown in FIG. 32). Each bandpass filter circuit BPF4, BPF7 comprises a three-stage resonator comprising three resonator lines $lb1i1$ to $lb1i3$ ($lb3i1$ to $lb3i3$) each having one end grounded and the other end connected to a grounded capacitance $cb1i1$ to $cb1i3$ ($cb3i1$ to $cb3i3$). Because the directions of the resonator lines and the structure of the jump capacitance $cb1i4$ ($cb3i4$) are the same as in the bandpass filter circuits BPF14, BPF 16, their explanation will be omitted. Likewise, the bandpass filter circuits BPF5, BPF8 also have the same equivalent circuit (shown in FIG. 33). Each bandpass filter circuit BPF5, BPF8 comprises a three-stage resonator comprising three resonator lines $lb2i1$ to $lb2i3$ ($lb4i1$ to $lb4i3$) each having one end grounded and the other end connected to a grounded capacitance $cb2i1$ to $cb2i3$ ($cb4i1$ to $cb4i3$). Because the directions of resonator lines and the structure of the jump capacitance $cb2i4$ ($cb4i4$) are the same as in the bandpass filter circuits BPF14, BPF16, their explanation will be omitted. Incidentally, usable as the multiplexer circuit are, in addition to the multiplexer circuit having the equivalent circuit shown in FIG. 31, a multiplexer circuit comprising a lowpass filter constituted by an LC circuit and a phase line, a multiplexer circuit comprising a phase line and a highpass filter constituted by an LC circuit, a multiplexer circuit comprising a lowpass filter and a highpass filter each constituted by an LC circuit, etc.

As described above, because the bandpass filter circuit comprising three stages or more of resonators has a large Q value, the high-frequency device comprising such bandpass filter circuits suffers only low loss, with steep attenuation near the passband.

Referring to FIGS. 23-26, the arrangement of conductor patterns in the ceramic laminate substrate (laminate module) will be explained. The upper surface (first layer) of the ceramic laminate substrate is provided with pad electrodes for mounting semiconductor devices for the switch circuits, the high-frequency amplifier circuits and the low-noise amplifier circuits, ground electrodes, etc. The second layer has wiring patterns connected to the pad electrodes, etc. on the first layer, and the third layer has a ground electrode GND on its entire surface. To explain the bandpass filter circuit in detail, only the third layer having a ground electrode and the fifth to 18-th layers having the bandpass filter circuit are shown.

Line patterns lda2a to lda2c formed on the fifth to seventh layers are connected through via-electrodes to form a spiral phase line lda2 constituting the highpass filter part of the first receiving-side multiplexer circuit DIP1. A signal path connected to the antenna terminal via the highpass filter HPF1 is branched to a highpass filter part and a lowpass filter part at the end of the line pattern lda2a on the fifth layer. The end of the line pattern lda2a is connected to one end of a line pattern lda1a on the 11-th layer through a via-electrode. Line patterns lda1a to lda1c formed on the 11-th to 13-th layers are connected through via-electrodes to form a spiral phase line lda1 constituting a lowpass filter part of the first receiving-side multiplexer circuit DIP1. To miniaturize the laminate module, spiral phase lines lda2 and lda1 formed on different dielectric layers overlap in a lamination direction, and their interference is prevented by a ground electrode GND formed on the ninth layer between them. A low-frequency-side bandpass filter circuit connected to the lowpass filter part tends to have low impedance. Accordingly, the phase line lda1 is made wider than the phase line lda2 for easy impedance matching as shown in FIGS. 23-26.

Line patterns ldb1a to ldb1c, ldb2a to ldb2c constituting the phase lines ldb1, ldb2 of the second receiving-side multiplexer circuit DIP2 are formed on the same layers as those of the line patterns ldb1a to lda1c, lda2a to lda2c constituting the phase lines lda1, lda2 of the first receiving-side multiplexer circuit DIP1, and spirally connected through via-electrodes. Like the first receiving-side multiplexer circuit DIP1, the spiral phase lines ldb1 and ldb2 overlap in a lamination direction to miniaturize the laminate module, with a ground electrode GND formed on the ninth layer between these spiral phase lines to prevent interference. This ground electrode GND is commonly used for the first and second receiving-side multiplexer circuits DIP1, DIP2. The phase lines of the first and second receiving-side multiplexer circuits DIP1, DIP2 are formed in a region partitioned in a planar direction by a shielding structure comprising lines of grounded via-electrodes and strip-shaped electrodes [elliptical portion (A) surrounded by dotted lines in transverse center portions of the fifth to eighth layers and the 10-th to 15-th layers], to miniaturize the laminate module. The spiral directions of phase lines are opposite in the first and second receiving-side multiplexer circuits DIP1, DIP2.

The bandpass filter circuits BPF4, BPF5 connected to the phase lines lda1, lda2 of the first receiving-side multiplexer circuit DIP1 are formed on the same dielectric layer to have low loss. Specifically, the resonator lines lb1i1 to lb1i3, lb2i1 to lb2i3 for the bandpass filter circuits BPF4, BPF5 are constituted by parallel lines obtained by connecting strip-shaped resonator line patterns on the seventh to ninth layers end to end through via-electrodes. For convenience, the reference numerals of the resonator lines are shown only on the seventh layer. The resonator line patterns are arranged in parallel in a transverse direction on the same layer, so that adjacent resonator line patterns are electromagnetically coupled. This is true of the other bandpass filter circuits. Resonator line patterns in the high-frequency-side bandpass filter circuit BPF5 are wider than those in the low-frequency-side bandpass filter circuit BPF4. The bandpass filter circuits BPF4, BPF5 are formed in regions partitioned in a planar direction by linear shielding structures comprising lines of grounded via-electrodes and strip-shaped electrodes [rectangular portions (B) surrounded by dotted lines on the fifth to 13-th layers and the 15-th and 17-th layers], to miniature the laminate module. The shielding via-electrodes connect a ground electrode on the bottom surface of the ceramic laminate substrate to internal ground electrodes. The term "linear" used herein means a shape which need only have a linear portion, and may have a cross, a branch, a step, or a bent portion. It is more preferable, however, that the shielding structure does not have steps and bent portions along its entire length.

Bandpass filter circuits BPF7, BPF8 connected to the phase lines ldb1, ldb2 of the second receiving-side multiplexer circuit DIP2 are also formed on the same dielectric layer. Specifically, resonator lines lb3i1 to lb3i3, lb4i1 to lb4i3 for the bandpass filter circuits BPF7, BPF8 are constituted by parallel lines obtained by connecting strip-shaped resonator line patterns end to end through via-electrodes on the seventh to ninth layers. Because the widths of the resonator line patterns and the structure of the shielding structures are the same as in the bandpass filter circuits BPF4, BPF5, their explanation will be omitted.

A bandpass filter BPF 13 connected between the first receiving terminal Rx_2.5G_1 for the first communications system and the low-noise amplifier circuit LNA1, and a bandpass filter BPF14 connected between the first receiving terminal Rx_3.5G_1 for the second communications system and the low-noise amplifier circuit LNA2 are partially formed on the same dielectric layer. Specifically, resonator lines lb1r1 to lb1r3 for the bandpass filter circuit BPF13 are respectively constituted by parallel lines comprising strip-shaped resonator line patterns connected end to end on four layers (seventh to 10-th layers), and resonator lines lb2r1 to lb2r3 for the bandpass filter circuit BPF14 are respectively constituted by parallel lines comprising strip-shaped resonator line patterns connected end to end on three layers (seventh to ninth layers). For convenience, the numerical references of the resonator lines are shown only on the ninth layer. This structure provides the bandpass filter circuit with low loss. The resonator line patterns for the high-frequency-side bandpass filter circuit BPF14 are wider than those of the low-frequency-side bandpass filter circuit BPF13.

Bandpass filter circuits BPF13 and BPF14 are formed in regions partitioned in a planar direction by shielding structures comprising lines of grounded via-electrodes and strip-shaped electrodes. To secure sufficient isolation between the input and output of each amplifier, lines of shielding via-electrodes and strip-shaped shielding electrodes are arranged between filters used on the input and output sides [shown by (C) and (C') on the eighth layer in FIG. 24]. Except for the eighth layer, these positions are not shown. The shielding structure (C) comprising lines of grounded via-electrodes and strip-shaped shielding electrodes are arranged between the bandpass filter circuits on the input and output sides of the low-noise amplifier circuit. To have high isolation between the input and output sides of the low-noise amplifier circuit, the lines of shielding via-electrodes (C) between resonator lines for the bandpass filter circuits on the input and output sides of the low-noise amplifier circuit have a smaller interval than that of the lines of shielding via-electrodes (B) between resonator lines for the bandpass filter circuit in each receiving path. Plural lines of shielding via-electrodes (C') are arranged between the bandpass filter circuit on the input side of the high-frequency amplifier circuit and the output-matching circuit on the output side of the high-frequency amplifier circuit. Plural lines of shielding via-electrodes also act as thermal via-electrodes. This structure reduces the distance between the filters while keeping sufficient isolation, thereby miniaturizing the laminate module.

A bandpass filter BPF15 connected between the second receiving terminal Rx_2.5G_2 for the first communications system and the low-noise amplifier circuit LNA4, and a bandpass filter BPF16 connected between the second receiving terminal Rx_3.5G_2 for the second communications system and the low-noise amplifier circuit LNA5 are partially formed on the same dielectric layer. Specifically, resonator lines lb3r1 to lb3r3 for the bandpass filter circuit BPF15 are constituted by parallel lines comprising strip-shaped resonator line patterns connected end to end through via-electrodes on the seventh to 10-th layers, and resonator lines lb4r1 to lb4r3 for the bandpass filter circuit BPF16 are constituted by parallel lines comprising strip-shaped resonator line patterns connected end to end on the seventh to ninth layers. This structure provides the bandpass filter circuit with low loss. Because the number and width of resonator line patterns, etc. are the same as in the bandpass filter circuits BPF13, BPF14, their explanation will be omitted.

The bandpass filter circuit BPF1 connected between the transmitting terminal Tx_2.5G for the first communications system and the high-frequency amplifier circuit PA1 is formed on the same dielectric layers as the bandpass filter circuits BPF13, BPF15. Specifically, resonator lines lba1 to lba3 for the bandpass filter circuit BPF1 are constituted by parallel lines comprising strip-shaped resonator line patterns connected end to end through via-electrodes on the seventh to 10-th layers. For convenience, the reference numerals of the resonator lines are shown only on the eighth layer. This structure provides the bandpass filter circuit with low loss.

The bandpass filter circuit BPF2 connected between the transmitting terminal Tx_3.5G for the second communications system and the high-frequency amplifier circuit PA2 is formed on the same dielectric layers as the bandpass filter circuits BPF13, BPF15 and BPF1. Specifically, resonator lines lbb1 to lbb4 for the bandpass filter circuit BPF2 are constituted by parallel lines comprising strip-shaped resonator line patterns connected end to end through via-electrodes on the seventh to 10-th layers. For convenience, the reference numerals of the resonator lines are shown only on the eighth layer. This structure provides the bandpass filter circuit with low loss. The bandpass filter circuit disposed in the transmitting path for the second communications system using a higher frequency than that of the first communications system comprises many resonators, (a) to reduce spurious noise contained in transmitting signals near the passband, and (b) to have steep attenuation characteristics. The bandpass filter circuits BPF1, BPF14, BPF13, BPF15, BPF16 and BPF2 are arranged in parallel in this order without interposition of other circuit elements than the linear shielding structures comprising lines of grounded via-electrodes and strip-shaped electrodes. The bandpass filter circuits BPF5, BPF4, BPF7, BPF8 for the multiplexer circuits are also arranged in parallel in this order without interposition of other circuit elements than the linear shielding structures comprising lines of grounded via-electrodes and strip-shaped electrodes. Each bandpass filter circuit is arranged with its resonator lines oriented in the same direction in each rectangular region partitioned by the shielding structure. This structure is particularly effective for the miniaturization of the laminate module.

In the embodiment shown in FIGS. 23-26, the receiving path connected to the first receiving terminal of the first communications system and the receiving path connected to the second receiving terminal of the first communications system are arranged symmetrically with respect to a longitudinal centerline of the rectangular ceramic laminate substrate. The receiving path connected to the first receiving terminal of the second communications system and the receiving path connected to the second receiving terminal of the second communications system are also arranged symmetrically with respect to the longitudinal centerline of the rectangular ceramic laminate substrate. Such arrangement contributes to the improvement of characteristic balance and easy designing. The transmitting path connected to the transmitting terminal of the first communications system and the transmitting path connected to the transmitting terminal of the second communications system are arranged on both longitudinal ends of the rectangular ceramic laminate substrate. Because the high-frequency amplifier disposed in the transmitting path has an amplification ratio of 30 dB or more, it is arranged preferably at an end of the ceramic laminate substrate to prevent interference with other circuit elements as much as possible. With the receiving paths arranged in a center portion, and the transmitting paths arranged in both end portions, a high-frequency device having excellent attenuation characteristics and isolation characteristics can be obtained.

Electrodes for the grounded capacitance and coupling capacitance of the bandpass filter circuits are formed on the 15-th to 17-th layers sandwiched by the 14-th layer and the 18-th layer having ground electrodes overlapping the resonator line patterns in a lamination direction. Namely, the electrodes for the grounded capacitance and coupling capacitance are located on the opposite side in a lamination direction to the resonator line patterns with respect to the 14-th layer having a ground electrode. Thus, these capacitance electrodes formed on different dielectric layers from those of the resonator line patterns are not directly opposite to the resonator line patterns. Electrodes for the grounded capacitance and coupling capacitance for each bandpass filter circuit are formed on the same dielectric layers.

The balanced-unbalanced conversion circuits BAL1 to BAL6 are adjacent to the bandpass filter circuits BPF1, BPF13 to BPF16, BPF2, respectively, via shielding structures comprising lines of grounded via-electrodes and strip-shaped electrodes. The balanced-unbalanced conversion circuits BAL1 to BAL6 are arranged in parallel via a shielding structures comprising lines of grounded via-electrodes and strip-shaped electrodes. For convenience, the reference numerals of the resonator lines are shown only on the 12-th layer.

As described above, the resonator lines of the bandpass filter circuit BPF1 connected between the transmitting terminal Tx_2.5G for the first communications system and the high-frequency amplifier circuit PA1, and the resonator lines of the bandpass filter circuit BPF2 connected between the transmitting terminal Tx_3.5G for the second communications system and the high-frequency amplifier circuit PA2 are arranged in both end portions of the laminate substrate. Each of the resonator lines of the bandpass filter circuits BPF1, BPF2 and the resonator lines of the bandpass filter circuits in the receiving paths is formed in a region partitioned in a planar direction by a shielding structure comprising lines of grounded via-electrodes and strip-shaped electrodes, and the resonator lines are arranged in parallel in a transverse direction in each partition. Because all resonator lines of the bandpass filter circuit formed in the laminate module are oriented in the same direction, (a) there is small space loss even if there are many bandpass filter circuits, thereby miniaturizing the laminate module, and (b) laminate modules printed with conductor patterns have reduced unevenness of characteristics.

The resonator lines of the bandpass filter circuits in each of signal paths connected to the transmitting terminals and the receiving terminals are arranged in regions partitioned by shielding structures in the laminate substrate. The resonator lines of each bandpass filter circuit extend in a transverse direction in each region. Bandpass filter circuits in the same signal path are arranged adjacently in a transverse direction of the laminate substrate (in a longitudinal direction of the resonator lines), via shielding structures comprising lines of grounded via-electrodes and strip-shaped electrodes. This structure prevents interference between the signal paths, and miniaturizes the laminate module. In the laminate substrate shown in FIGS. 23-26, the transmitting path for the first communications system, the receiving path connected to the first receiving terminal for the second communications system, the receiving path connected to the first receiving terminal for the first communications system, the receiving path connected to the second receiving terminal for the first communications system, the receiving path connected to the second receiving terminal for the second communications system, and the transmitting path for the second communications system are arranged longitudinally in this order from the left in the figures.

Figure 34:
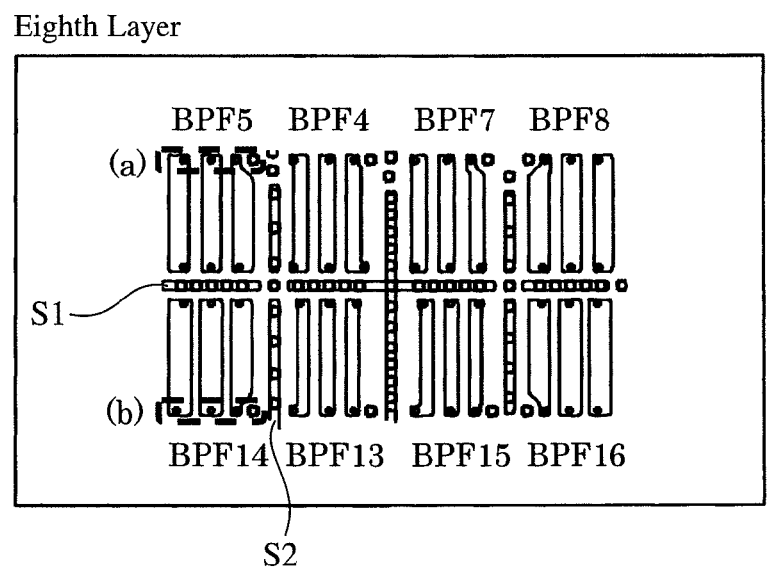
FIG. 34 is a view showing part of electrode patterns on the eighth layer in the developed view of FIG. 24.

Pluralities of bandpass filter circuits disposed in the same signal path are arranged, such that their input and output terminals are not adjacent to each other in the longitudinal direction of the resonator lines. Term "the same signal path" used herein means a signal path connected to the same high-frequency terminal (receiving or transmitting terminal). As an example of such arrangements, FIG. 34 shows resonator lines of the bandpass filter circuits in the receiving path formed on the eighth layer. As described above, the bandpass filter circuits BPF5 and BPF14 disposed in the receiving path of the second communications system connected to the first antenna terminal are adjacent to each other in the longitudinal direction of resonator lines via a shielding structure S1. Because only the shielding structure S1 exists between the bandpass filter circuits BPF5 and BPF14, miniaturization can be achieved. The input and output terminals of the bandpass filter circuit BPF5 are located on one longitudinal end side of resonator lines [shown by (a) in FIG. 34], and the input and output terminals of the bandpass filter circuit BPF14 are located on the other longitudinal end side of resonator lines [shown by (b) in FIG. 34]. Namely, their input and output terminals are located at far ends of resonator lines from the shielding structure S1. ICs for the low-noise amplifier circuits are arranged above the shielding structure S1 in a lamination direction. With the input and output terminals of the bandpass filter circuits BPF5 and BPF 14 being separated in the longitudinal direction of the resonator lines, there is high isolation between them, thereby suppressing the oscillation of the low-noise amplifiers. This is true of the bandpass filter circuits BPF4 and BPF 13 disposed in the receiving path of the first communications system connected to the first antenna terminal, the bandpass filter circuits BPF7 and BPF15 disposed in the receiving path of the first communications system connected to the second antenna terminal, and the bandpass filter circuits BPF8 and BPF 16 disposed in the receiving path of the second communications system connected to the second antenna terminal.

Figure 35:
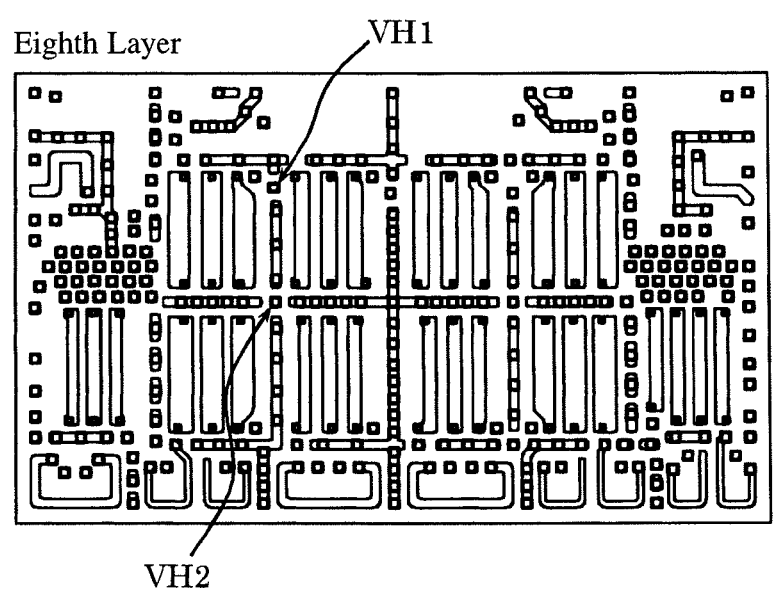
FIG. 35 is a view showing electrode patterns on the eighth layer in the developed view of FIG. 24.

Taking the eighth layer shown in FIG. 35 for example, the structure of the laminate module will be further explained. Via-electrodes (for example, VH1, VH2) of power supply lines applying voltage to semiconductor devices for switch circuits, high-frequency amplifier circuits or low-noise amplifier circuits mounted on a main surface (upper surface) of the laminate module are arranged in the linear shielding structures. When the via-electrodes of power supply lines are arranged in the shielding structures in the laminate module containing pluralities of bandpass filter circuits, space needed for their arrangement is reduced, resulting in the miniaturization of the laminate module. Particularly when via-electrodes of power supply lines are arranged at intersections of the linear shielding structures like the via-electrodes VH2, there is enough distance from high-frequency circuit elements such as bandpass filter circuits. Each power supply terminal on the bottom surface is connected to one end of each power supply line formed on the 19-th layer (not shown) through via-electrodes, and the other end of each power supply line is connected to via-electrodes formed at positions as shown in FIG. 35. Via-electrodes of power supply lines disposed in the linear shielding structures are formed in pluralities of layers as shown in FIGS. 23-26, and connected to pad electrodes formed on the top surface directly or via power supply lines formed on the second layer (not shown). The via-electrodes of the power supply lines may be disposed on an extension of each linear shielding structure.

Figure 36:
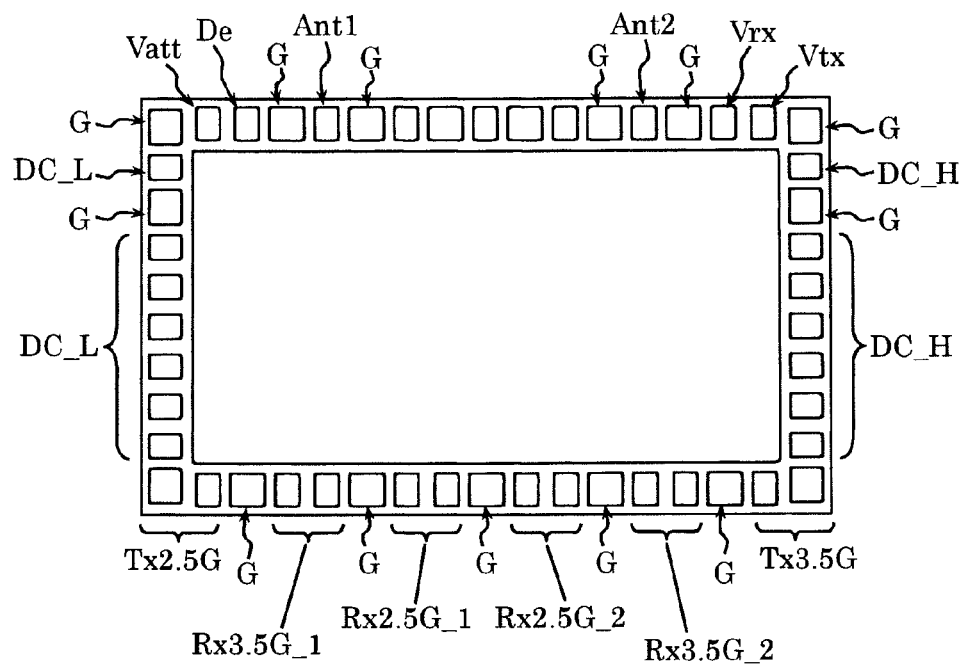
FIG. 36 is a bottom view showing the arrangement of terminals on a bottom surface of a laminate module, which is a high-frequency device according to another embodiment of the present invention.

FIG. 36 shows the arrangement of terminals on the bottom surface of the laminate module shown in FIGS. 23-26. A ground electrode formed on a rectangular bottom surface extends from its center to near edges, and terminal electrodes such as high-frequency terminals (antenna terminals, receiving terminals and transmitting terminals), power supply terminals of the high-frequency amplifier circuits and the switch circuits, ground terminals, etc. are formed along each side around the ground electrode. The antenna terminals Ant1, Ant2 are arranged along a first longitudinal side of the bottom surface, with ground terminals G on both sides thereof. In the first longitudinal side, control terminals Vrx, Vtx of the switch circuits, a power supply terminal Vatt of a high-frequency amplifier circuit commonly used in the first and second communications systems, and a detection terminal De detecting the level of signals amplified by the high-frequency amplifier circuits PA1, PA2 are arranged, but high-frequency terminals such as receiving terminals, transmitting terminals, etc. are not arranged. Terminals with no symbols are ground terminals and dummy terminals. All high-frequency terminals except for the antenna terminals Ant1, Ant2 are arranged along a second longitudinal side opposing the first longitudinal side. The receiving terminals and the transmitting terminals, which are balance terminals, are arranged in parallel via the ground terminal G All of the power supply terminals and control terminals DC_L of the high-frequency amplifier circuit PA1 and the low-noise amplifier circuits LNA1, LNA4 for the first communications system on the low frequency side are arranged on the first transverse side perpendicular to the longitudinal side. The power supply terminals and control terminals DC_H of the high-frequency amplifier circuit PA2 and the low-noise amplifier circuits LNA2, LNA5 for the second communications system on the high frequency side are arranged on the second transverse side opposing the first transverse side. Each ground terminal G suppresses the interference of terminals disposed on both sides thereof The structure shown in FIG. 36 provides the high-frequency terminal with high isolation. The above structures shown in FIGS. 23-26, 36, etc. are particularly suitable for high-frequency devices of a MIMO system having many receiving and transmitting paths.

Figure 37:
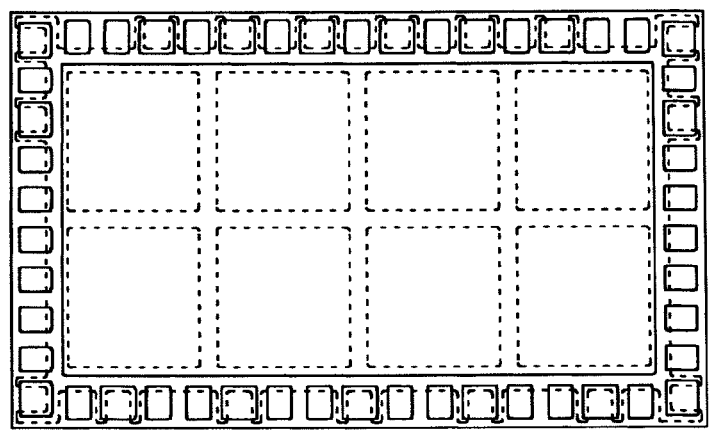
FIG. 37 is a bottom view showing a bottom surface of a laminate module, which is a high-frequency device according to another embodiment of the present invention.

As shown in FIG. 37, a ceramic overcoat is formed in regions shown by the dotted lines in the bottom surface shown in FIG. 36. To increase adhesion, each terminal is covered with the overcoat except for its end edge. The ground electrode in a center portion of the bottom surface is divided to pluralities of rectangular regions by the overcoat, resulting in increased adhesion and a reduced amount of solders used for mounting.

The structure of the above multiplexer circuit and/or the structure of the laminate module comprising pluralities of bandpass filter circuits, which are explained referring to FIGS. 23-26, 34, 35, etc., are applicable to high-frequency devices having other high-frequency circuits than that of the present invention, with the arrangement of the multiplexer circuits, bandpass filter circuits, etc. properly changed. As one example of such high-frequency devices, there is a high-frequency device comprising antenna terminals and multiplexer circuits connected thereto; the high-frequency device comprising an integral laminate comprising pluralities of dielectric layers having electrode patterns for a high-frequency circuit used for transmission and/or receiving in first and second communications systems of different frequency bands, and devices mounted on the laminate; each multiplexer circuit comprising a first filter part passing signals for the first communications system and blocking signals for the second communications system, and a second filter part passing signals for the second communications system and blocking signals for the first communications system; the first filter and the second filter being formed by phase lines, the phase line of the first filter part being connected to a bandpass filter circuit passing signals for the first communications system, and the phase line of the second filter part being connected to a bandpass filter circuit passing signals for the second communications system; each phase line being formed by spirally connecting electrode patterns on pluralities of dielectric layers in a lamination direction; and a ground electrode being arranged between the spiral electrode patterns.

As one example of high-frequency devices comprising pluralities of bandpass filter circuits, there is also a high-frequency device comprising an integral laminate comprising pluralities of dielectric layers having electrode patterns for a high-frequency circuit used for transmission and/or receiving in first and second communications systems of different frequency bands, and devices mounted on the laminate; the high-frequency device having pluralities of bandpass filter circuits, each bandpass filter circuit having pluralities of strip-shaped resonator lines formed in the laminate, all of pluralities of resonator lines extending in the same direction in the bandpass filter circuits; and pluralities of bandpass filter circuits being arranged adjacently via shielding structures each comprising lines of grounded via-electrodes and strip-shaped electrodes. There is further a high-frequency device comprising an integral laminate comprising pluralities of dielectric layers having electrode patterns for a high-frequency circuit used for the transmission and/or receiving of high-frequency signals, and devices such as semiconductor devices, etc. mounted on the laminate; linear shielding structures being arranged between circuit elements of the high-frequency circuit in a planar direction on the dielectric layer; and via-electrodes for power supply lines for applying voltage to the semiconductor devices being arranged in the linear shielding structures and/or on their extensions in a planar direction.

Using the high-frequency device of the present invention having the above feature, small communications apparatuses of a MIMO system capable of handling different frequency bands can be obtained at low cost. The high-frequency device of the present invention can be used widely for mobile gears, personal computers, etc. with wireless communication functions.

Effect of the Invention

The present invention provides MIMO-type high-frequency circuits and devices capable of handling different communications systems, and communications apparatuses comprising such high-frequency devices, with improved receiving sensitivity and suppressed transmission power loss.

What is claimed is:

1. A high-frequency circuit comprising:
   first and second antenna terminals, a transmitting terminal and first and second receiving terminals for a first communications system, a transmitting terminal and first and second receiving terminals for a second communications system, and first and second switch circuits for switching connections to transmitting paths and receiving paths, each having a common terminal and at least first and second switching terminals;
   said first antenna terminal being connected to the common terminal of said first switch circuit, and said transmitting terminal for the first communications system being connected to the first switching terminal of said first switch circuit in a first transmitting path;
   said second antenna terminal being connected to the common terminal of said second switch circuit, and said transmitting terminal for the second communications system being connected to the first switching terminal of said second switch circuit in a second transmitting path;
   said first receiving terminal for the first communications system and said first receiving terminal for the second communications system being connected to the second switching terminal of said first switch circuit via a first receiving-side multiplexer circuit in a first receiving path; and
   said second receiving terminal for the first communications system and said second receiving terminal for the second communications system being connected to the second switching terminal of said second switch circuit via a second receiving-side multiplexer circuit in a second receiving path.

2. A high-frequency circuit comprising:
   first and second antenna terminals, a transmitting terminal and first and second receiving terminals for a first communications system, a transmitting terminal and first and second receiving terminals for a second communications system, and first and second switch circuits for switching connections to transmitting paths and receiving paths, each having a common terminal and first to third switching terminals;
   said first antenna terminal being connected to the common terminal of said first switch circuit, and said transmitting terminal for the first communications system being connected to the first switching terminal of said first switch circuit in a first transmitting path;
   said second antenna terminal being connected to the common terminal of said second switch circuit, and said transmitting terminal for the second communications system being connected to the first switching terminal of said second switch circuit in a second transmitting path;
   said first receiving terminal for the first communications system being connected to the second switching terminal of said first switch circuit in a first receiving path, and said first receiving terminal for the second communications system being connected to the third switching terminal of said first switch circuit in a second receiving path; and
   said second receiving terminal for the first communications system being connected to the second switching terminal of said second switch circuit in a third receiving path, and said second receiving terminal for the second communications system being connected to the third switching terminal of said second switch circuit in a fourth receiving path.

3. The high-frequency circuit according to claim 1, further comprising:
- a transmitting terminal and first and second receiving terminals for the third communications system;
- said second switch circuit having a third switching terminal;
- said first and second receiving-side multiplexer circuits being triplexers;
- the first receiving terminal for said third communications system being connected to the second switching terminal of said first switch circuit via said first receiving-side multiplexer circuit;
- the second receiving terminal for said third communications system being connected to the second switching terminal of said second switch circuit via said second receiving-side multiplexer circuit; and
- the transmitting terminal for said third communications system being connected to the third switching terminal of said second switch circuit in a third transmitting path.

4. The high-frequency circuit according to claim 1, further comprising:
- a third antenna terminal, a third receiving terminal for the first communications system, and a third receiving terminal for the second communications system, said third receiving terminal for the first communications system and said third receiving terminal for the second communications system being connected to said third antenna terminal via the third receiving-side multiplexer circuit.

5. The high-frequency circuit according to claim 1, further comprising:
- a third antenna terminal, a third switch circuit having a common terminal and at least first and second switching terminals for switching connections to transmitting paths and receiving paths, a third receiving-side multiplexer circuit, a third receiving terminal for the first communications system, a third receiving terminal for the second communications system, and a transmitting terminal and first to third receiving terminals for the third communications system,
- said first to third receiving-side multiplexer circuits being triplexers;
- the first receiving terminal for said third communications system being connected to the second switching terminal of said first switch circuit via said first receiving-side multiplexer circuit;
- the second receiving terminal for said third communications system being connected to the second switching terminal of said second switch circuit via said second receiving-side multiplexer circuit;
- said third antenna terminal being connected to a common terminal of said third switch circuit, and the transmitting terminal for said third communications system being connected to the first switching terminal of said third switch circuit in a third transmitting path; and
- the third receiving terminals for said first to third communications systems being connected to the second switching terminal of said third switch circuit via said third receiving-side multiplexer circuit in a third receiving path.

6. The high-frequency circuit according to claim 1, wherein a low-noise amplifier circuit is connected to said receiving-side multiplexer circuit on the antenna terminal side.

7. The high-frequency circuit according to claim 1, comprising:
- a high-frequency amplifier circuit connected between said transmitting terminal for the first communications system and said first switch circuit;
- a first low-noise amplifier circuit connected between said first receiving terminal for the first communications system and said first switch circuit;
- a second low-noise amplifier circuit connected between said second receiving terminal for the first communications system and said second switch circuit;
- a first branching circuit having a common terminal connected to said high-frequency amplifier circuit;
- a second branching circuit having a common terminal connected to said transmitting terminal for the first communications system;
- a third branching circuit having a common terminal connected to said first low-noise amplifier circuit;
- a fourth branching circuit having a common terminal connected to said first receiving terminal for the first communications system;
- a fifth branching circuit having a common terminal connected to said second low-noise amplifier circuit; and
- a sixth branching circuit having a common terminal connected to said second receiving terminal for the first communications system;
- bandpass filter circuits being connected between the first branching terminal of said first branching circuit and the first branching terminal of said second branching circuit, between the second branching terminal of said first branching circuit and the second branching terminal of said second branching circuit, between the first branching terminal of said third branching circuit and the first branching terminal of said fourth branching circuit, between the second branching terminal of said third branching circuit and the second branching terminal of said fourth branching circuit, between the first branching terminal of said fifth branching circuit and the first branching terminal of said sixth branching circuit, and between the second branching terminal of said fifth branching circuit and the second branching terminal of said sixth branching circuit, respectively.

8. The high-frequency circuit according to claim 1, further comprising:
- a high-frequency amplifier circuit connected between said transmitting terminal for the first communications system and said first switch circuit;
- a first low-noise amplifier circuit connected between said first receiving terminal for the first communications system and said first switch circuit; and
- a second low-noise amplifier circuit connected between said second receiving terminal for the first communications system and said second switch circuit;
- tunable bandpass filter circuits being connected between said high-frequency amplifier circuit and said transmitting terminal for the first communications system, between said first low-noise amplifier circuit and said first receiving terminal for the first communications system, and between said second low-noise amplifier circuit and said second receiving terminal for the first communications system, respectively.

9. A high-frequency device comprising the high-frequency circuit recited in claim 1, which comprises an integral laminate comprising pluralities of dielectric layers having electrode patterns for said high-frequency circuit, and devices mounted on said laminate.

10. The high-frequency device according to claim 9, wherein said laminate contains pluralities of bandpass filter circuits each having pluralities of linear resonator lines arranged in parallel, all resonator lines of pluralities of said bandpass filter circuits extending in the same direction.

11. The high-frequency device according to claim 9, wherein said laminate comprises pluralities of bandpass filter circuits each having pluralities of linear resonator lines arranged in parallel, pluralities of bandpass filter circuits disposed in the same signal path being arranged adjacently in the longitudinal direction of the resonator lines via shielding structures comprising lines of grounded via-electrodes and strip-shaped electrodes, and the input and output terminals of each bandpass filter circuit being arranged at far ends of the resonator lines from said shielding structures.

12. A high-frequency device comprising the high-frequency circuit recited in claim 1, which comprises an integral laminate comprising:
    pluralities of dielectric layers having electrode patterns for said high-frequency circuit, and devices mounted on said laminate;
    each multiplexer circuit having a first filter part passing signals for the first communications system and blocking signals for the second communications system, and a second filter part passing signals for the second communications system and blocking signals for the first communications system, both first and second filter parts being constituted by phase lines;
    the phase lines of said first filter part being connected to a bandpass filter circuit passing signals for the first communications system, and the phase lines of said second filter part being connected to a bandpass filter circuit passing signals for the second communications system;
    each phase line being formed by spirally connecting electrode patterns on pluralities of dielectric layers in a lamination direction; and
    a ground electrode being arranged between said spiral phase lines.

13. The high-frequency device according to claim 12, wherein ground electrodes are arranged such that they sandwich the spiral phase lines of said first filter part and the spiral phase lines of said second filter part in a lamination direction.

14. A communications apparatus comprising the high-frequency device recited in claim 9.

15. The high-frequency circuit according to claim 2, further comprising:
    a third antenna terminal, a third receiving terminal for the first communications system, and a third receiving terminal for the second communications system, said third receiving terminal for the first communications system and said third receiving terminal for the second communications system being connected to said third antenna terminal via the third receiving-side multiplexer circuit.

16. The high-frequency circuit according to claim 2, comprising:
    a high-frequency amplifier circuit connected between said transmitting terminal for the first communications system and said first switch circuit;
    a first low-noise amplifier circuit connected between said first receiving terminal for the first communications system and said first switch circuit;
    a second low-noise amplifier circuit connected between said second receiving terminal for the first communications system and said second switch circuit;
    a first branching circuit having a common terminal connected to said high-frequency amplifier circuit;
    a second branching circuit having a common terminal connected to said transmitting terminal for the first communications system;
    a third branching circuit having a common terminal connected to said first low-noise amplifier circuit;
    a fourth branching circuit having a common terminal connected to said first receiving terminal for the first communications system;
    a fifth branching circuit having a common terminal connected to said second low-noise amplifier circuit; and
    a sixth branching circuit having a common terminal connected to said second receiving terminal for the first communications system;
    bandpass filter circuits being connected between the first branching terminal of said first branching circuit and the first branching terminal of said second branching circuit, between the second branching terminal of said first branching circuit and the second branching terminal of said second branching circuit, between the first branching terminal of said third branching circuit and the first branching terminal of said fourth branching circuit, between the second branching terminal of said third branching circuit and the second branching terminal of said fourth branching circuit, between the first branching terminal of said fifth branching circuit and the first branching terminal of said sixth branching circuit, and between the second branching terminal of said fifth branching circuit and the second branching terminal of said sixth branching circuit, respectively.

17. The high-frequency circuit according to claim 2, comprising:
    a high-frequency amplifier circuit connected between said transmitting terminal for the first communications system and said first switch circuit;
    a first low-noise amplifier circuit connected between said first receiving terminal for the first communications system and said first switch circuit; and
    a second low-noise amplifier circuit connected between said second receiving terminal for the first communications system and said second switch circuit;
    tunable bandpass filter circuits being connected between said high-frequency amplifier circuit and said transmitting terminal for the first communications system, between said first low-noise amplifier circuit and said first receiving terminal for the first communications system, and between said second low-noise amplifier circuit and said second receiving terminal for the first communications system, respectively.

18. A high-frequency device comprising the high-frequency circuit recited in claim 2, which comprises an integral laminate comprising pluralities of dielectric layers having electrode patterns for said high-frequency circuit, and devices mounted on said laminate.

19. The high-frequency device according to claim 18, wherein said laminate contains pluralities of bandpass filter circuits each having pluralities of linear resonator lines arranged in parallel, all resonator lines of pluralities of said bandpass filter circuits extending in the same direction.

20. The high-frequency device according to claim 18, wherein said laminate comprises pluralities of bandpass filter circuits each having pluralities of linear resonator lines arranged in parallel, pluralities of bandpass filter circuits disposed in the same signal path being arranged adjacently in the longitudinal direction of the resonator lines via shielding structures comprising lines of grounded via-electrodes and strip-shaped electrodes, and the input and output terminals of each bandpass filter circuit being arranged at far ends of the resonator lines from said shielding structures.

21. A communications apparatus comprising the high-frequency device recited in claim 18.

\* \* \* \* \*